(12) United States Patent
Yu et al.

(10) Patent No.: US 6,906,561 B2
(45) Date of Patent: Jun. 14, 2005

(54) CASCODE STAGE INPUT/OUTPUT DEVICE

(75) Inventors: Shifeng Jack Yu, Fremont, CA (US); Cong Q. Khieu, San Jose, CA (US); Fabrizio Romano, deceased, late of Sunnyvale, CA (US); by Ivana Cappellano, legal representative, Palermo (IT)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/158,819

(22) Filed: May 30, 2002

(65) Prior Publication Data

US 2003/0222682 A1 Dec. 4, 2003

(51) Int. Cl.[7] .................................................. H03B 1/00
(52) U.S. Cl. ........................ 327/112; 327/391; 326/81
(58) Field of Search ....................... 327/108–112, 170, 327/379, 389, 391, 333; 326/30–32, 34, 68, 80, 81, 83, 86, 87

(56) References Cited

U.S. PATENT DOCUMENTS

| | | | |
|---|---|---|---|
| 5,463,331 A | | 10/1995 | Kuo ............................ 327/112 |
| 5,736,869 A | * | 4/1998 | Wei .............................. 326/81 |
| 5,773,999 A | | 6/1998 | Park et al. ................... 327/108 |
| 5,955,894 A | | 9/1999 | Vishwanthaiah et al. ..... 326/86 |
| 5,999,978 A | | 12/1999 | Angal et al. ................. 709/229 |
| 6,031,394 A | * | 2/2000 | Cranford et al. .............. 326/81 |
| 6,060,907 A | | 5/2000 | Vishwanthaiah et al. ..... 326/87 |
| 6,064,656 A | | 5/2000 | Angal et al. ................. 370/254 |
| 6,085,033 A | | 7/2000 | Starr et al. ............. 395/500.15 |
| 6,212,511 B1 | | 4/2001 | Fisher et al. .................... 707/1 |
| 6,218,863 B1 | | 4/2001 | Hsu et al. ....................... 326/87 |
| 6,278,306 B1 | | 8/2001 | Ang et al. .................... 327/170 |
| 6,281,729 B1 | | 8/2001 | Ang et al. .................... 327/170 |
| 6,294,924 B1 | | 9/2001 | Ang et al. ..................... 326/30 |
| 6,297,677 B1 | | 10/2001 | Ang et al. .................... 327/170 |
| 6,310,496 B1 | | 10/2001 | Nomura ........................ 326/87 |
| 6,316,957 B1 | | 11/2001 | Ang et al. ..................... 326/30 |
| 6,339,351 B1 | | 1/2002 | Ang et al. .................... 327/170 |
| 6,353,346 B1 | | 3/2002 | Chan ........................... 327/112 |
| 6,366,139 B1 | | 4/2002 | Ang et al. .................... 327/108 |
| 6,366,149 B1 | | 4/2002 | Lee et al. .................... 327/276 |
| 6,420,913 B1 | | 7/2002 | Ang et al. .................... 327/108 |
| 6,486,698 B2 | * | 11/2002 | Yanagawa ..................... 326/30 |

OTHER PUBLICATIONS

Pending U.S. Appl. No. 10/102,564, filed Mar. 20, 2002, "A Dynamic Termination Logic Driver With Inproved Impedance Control;", Michael A. Ang, et al., including Specification: pp. 1–54; Drawings: Figures 1–18 on 18 sheets.

* cited by examiner

*Primary Examiner*—Long Nguyen
(74) *Attorney, Agent, or Firm*—Zagorin O'Brien Graham LLP

(57) ABSTRACT

Disclosed is an input/output (IO) device for transmitting an input data bit signal. In one embodiment, the IO device includes an IO device input node for receiving the input data bit signal and an IO device output node. The IO device also includes a driver coupled between the IO device input node and the IO device output node. The driver includes at least one FET that defines a gate oxide voltage limit. The driver receives a supply voltage and the input data bit signal. The driver charges and discharges the IO device output node to the supply voltage and ground, respectively, in response to driver receiving the supply voltage and the input data bit signal. The supply voltage is greater than the gate oxide voltage limit.

13 Claims, 13 Drawing Sheets

CASCODE STAGE INPUT/OUTPUT DEVICE

CROSS-REFERENCE TO RELATED APPLICATIONS

This application is related to U.S. patent application Ser. No. 10/159,881, filed May 30, 2002, U.S. patent application Ser. No. 10/159,002, filed May 30, 2002, and U.S. patent application Ser. No. 10/159,684, filed May 30, 2002.

BACKGROUND OF THE INVENTION

FIG. 1 illustrates in block diagram form a microprocessor 10 coupled to memory device 12 via a data bus 14. Although not shown, data bus 14 includes a plurality of conductive lines, each one of which is capable of transmitting a data bit signal between memory device 12 and microprocessor 10.

Microprocessor 10 includes a plurality of input/output (IO) devices (not shown in FIG. 1) coupled to respective conductive lines of data bus 14. IO devices transmit or receive data bit signals. FIG. 2 is a schematic diagram of a driver 16 contained in one of the IO devices of microprocessor 10. Driver 16 drives one of the conductive lines of data bus 14 in response to receiving an input data bit signal.

Driver 16 includes a p-channel field effect transistor 20, an n-channel field effect transistor 22, an input node 24, and an output node 26. Although not shown, output node 26 is coupled to a conductive line of data bus 14. P-channel field effect transistors will be referred to as p-channel FETs, and n-channel field effect transistors will be referred to as n-channel FETs. N-channel and p-channel FETs include a gate, a drain, and a source designated g, d, and s, respectively. The gates of FETs 20 and 22 are coupled to input node 24. The drains of FETs 20 and 22 are coupled to output node 26. The source of FET 20 is coupled to $V_{dd}$, while the source of FET 22 is coupled to $V_{cg}$. $V_{dd}$ is a supply voltage provided from a source external to microprocessor 12, while $V_{cg}$ is common ground.

In operation, input node 24 receives an input data bit signal $D_{in}$ directly or indirectly from the core of microprocessor 10. Although not shown, $D_{in}$ is typically provided to input node 24 by a signal inverting circuit. The input data bit signal $D_{in}$ varies between two voltage levels $V_{dd}$ or $V_{cg}$ representing a binary one or a binary zero, respectively. In response to receiving $D_{in}$ driver 16 chargers or discharges output node 26 and the conductive line of data bus 14 coupled thereto. When driver 16 receives $D_{in}$ equal to $V_{cg}$, driver 16 charges output node 26 to $V_{dd}$. When driver 16 receives $D_{in}$ equal to $V_{dd}$, driver 16 discharges output node 26 to $V_{cg}$. In this manner, driver 16 generates an output data bit signal $D_{out}$ at output node 26 that varies between $V_{dd}$ and $V_{cg}$ in response to receiving input data bit signal $D_{in}$ that varies between $V_{dd}$ and $V_{cg}$.

P-channel or n-channel FETs are often referred to as electronic switches. A p-channel FET is active or "switched on" when its gate voltage $V_g$ is a threshold voltage $V_t$ or more below its source voltage $V_s$. In other words, a p-channel FET is active when $V_g<V_s-V_t$. When active, a p-channel FET provides a very low impedance path between its source and drain such that current can flow therebetween. When its gate voltage $V_g$ is greater than a threshold voltage $V_t$ below its source voltage $V_s$ the p-channel FET is inactive. In other words, a p-channel FET is inactive when $V_g>V_s-V_t$. When inactive, essentially no current can flow between the p-channel FET's source and drain. In FIG. 2, p-channel FET 20 is active when the voltage of $D_{in}$ is $V_{cg}$ and inactive when $D_{in}$ is $V_{dd}$.

An n-channel FET is active or "switched on" when its gate voltage $V_g$ is a threshold voltage $V_t$ or more above its source voltage $V_s$. In other words, an n-channel FET is active when $V_g>V_s+V_t$. When active, an n-channel FET provides a very low impedance path between its source and drain such that current can flow therebetween. An n-channel FET is inactive when $V_g<V_s+V_t$. When inactive, essentially no current can flow between the n-channel FET's source and drain. In FIG. 2, n-channel FET 22 is active when the voltage of $D_{in}$ is $V_{dd}$ and inactive when $D_{in}$ is $V_{cg}$.

N-channel or p-channel FET operation is subject to limitations. More particularly, the voltage $V_{gd}$ between the gate and the drain of the devices or the voltage $V_{gs}$ between the gate and source of the devices should not exceed a gate oxide voltage limit $V_{limit}$. If $V_{gs}$ or $V_{gd}$ exceeds $V_{limit}$ in either a p-channel or n-channel FET, damage can occur to the FET that renders it permanently inoperable.

$V_{limit}$ (also known as gate oxide integrity) depends on failure in time (FIT) rate, the gate area of the FET, and/or the distance between the source and drain of the FET. The FIT rate requirement is provided by a system design specification. For p-channel and n-channel FETs manufactured using a 0.18 micron process, $V_{limit}$ may vary between 1.4–1.8 volts depending on how the p-channel FETs are operated. The $V_{limit}$ for p-channel and n-channel FETs of a particular size and used in a particular manner, can be determined based on experimental results.

The sizes of FETs, including the distance between sources and drains thereof, in microprocessors continue to reduce as semiconductor manufacturing technology advances. As FETs continue to reduce in size, so does their $V_{limit}$.

As noted above, driver 16 operates to charge or discharge output node 26, and thus the conductive line of data bus 14 and the memory device 12 coupled thereto, in accordance with the input data bit signal $D_{in}$. Characteristics of driver 16 are subject to variations in operational parameters such as temperature and/or magnitude of supply voltage $V_{dd}$. For example, an increase in operating temperature of driver 16 may increase its output impedance and potentially reduce driver 16's drive strength or ability to fully charge or discharge output node 26 within a predetermined amount of time.

Notwithstanding variations in operational parameters, which are dynamic in nature, the actual output impedance of driver 16 may not match the expected impedance of driver 16 due to unexpected and permanent variations in the physical structure of FETs 20 and 22. More particularly, microprocessors including their drivers are manufactured on silicon wafers using complex equipment and processes. Once completed, the microprocessors are severed from the silicon wafer and individually packaged for subsequent use. A single wafer, depending on its size, is capable of producing several microprocessors. In theory, each of these microprocessors should be identical to each other in physical structure. In practice, slight physical variations exist between these microprocessors. For example, due to variations in the fabrication process, the doping density in the source or drain regions of FETs 20 and 22 of driver 16, or the length or width of gates of FETs 20 and 22 of driver 16, may unexpectedly vary from microprocessor to microprocessor. These physical variations in the FETs are static in nature and may unexpectedly increase or decrease the output impedance of driver 16.

Generally, the output impedance of driver 16 can be represented as its output voltage V divided by its output current I. As noted above, the output impedance of driver 16 may vary with, for example, temperature and/or magnitude of $V_{dd}$. FIG. 3 illustrates IV curves that plot the output voltage V of driver 16 versus the output current I of driver 16. Each IV curve corresponds to driver 16 operating at different temperatures and/or magnitudes of $V_{dd}$. The IV curves of FIG. 3 were drawn with the presumption that no load is applied to output node 26.

As can be seen from FIG. 3, each of the IV curves are non-linear which means that the output impedance of driver 16 varies with its output voltage. The IV curves of FIG. 3 also show that output impedance of driver 16 varies with temperature and/or magnitude of $V_{dd}$ for a given output voltage V. The impedance of the conductive line and the memory device 12 coupled to output node 26, however, is static or substantially static. As a consequence, a mismatch generally occurs between the output impedance of driver 16 and the combined impedance of the conductive line and memory device 12. This mismatch of impedances may degrade or limit the ability of driver 16 to transmit data bit signals to memory device 12 for storage therein.

SUMMARY OF THE INVENTION

Disclosed is an input/output (IO) device for transmitting an input data bit signal. In one embodiment, the IO device includes an IO device input node for receiving the input data bit signal and an IO device output node. The IO device also includes a driver coupled between the IO device input node and the IO device output node. The driver includes at least one FET that defines a gate oxide voltage limit. The driver receives a supply voltage and the input data bit signal. The driver charges and discharges the IO device output node to the supply voltage and ground, respectively, in response to driver receiving the supply voltage and the input data bit signal. The supply voltage is greater than the gate oxide voltage limit.

In one embodiment, the driver includes first and second p-channel FETs each having a source, drain, and gate, and first and second n-channel FETs each having a source, drain, and gate. The gate of the first n-channel FET is coupled to the IO device input node. The drains of the first p-channel FET and the second n-channel FET are coupled to the IO device output node. The source of the second n-channel FET is coupled to the drain of the first n-channel FET. The source of the first p-channel FET is coupled to the drain of the second p-channel FET. The source of the second p-channel FET is coupled to the supply voltage when the driver receives the supply voltage.

A first circuit may be coupled between the IO device input node and the gate of the second p-channel FET. This first circuit receives the input data bit signal and the supply voltage and generates a modified input data bit signal which varies between the supply voltage and an intermediate voltage in response to receiving the supply voltage and the input data bit signal. The intermediate voltage is greater than ground but less than the supply voltage.

BRIEF DESCRIPTION OF THE DRAWINGS

The present invention may be better understood, and its numerous objects, features and advantages made apparent to those skilled in the art by referencing the accompanying drawings. The use of the same reference number throughout the figures designates a like or similar element.

Figure 1:
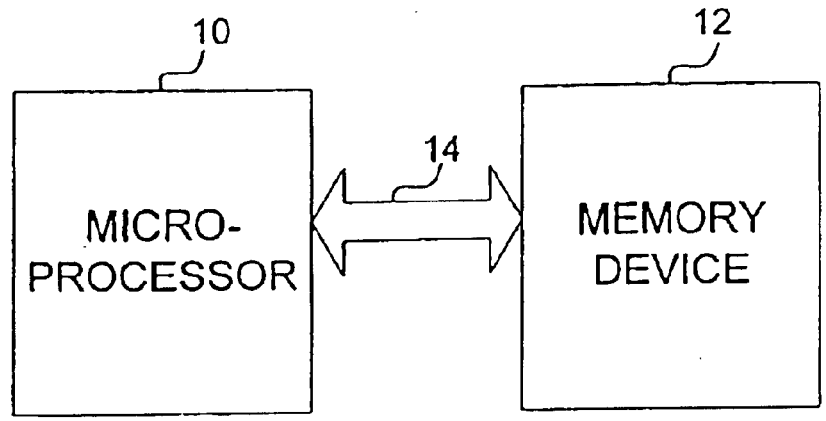
FIG. 1 is a block diagram of a microprocessor coupled to a memory device via a data bus.

While the invention is susceptible to various modifications and alternative forms, specific embodiments thereof are shown by way of example in the drawings and will herein be described in detail. However, the drawings and detailed description thereto are not intended to limit the invention to the particular form disclosed. On the contrary, the intention is to cover all modifications, equivalents, and alternatives falling within the spirit and scope of the present invention as defined by the appended claims.

DETAILED DESCRIPTION

Computer systems, including computer servers, employ one or more microprocessors coupled to one or more memory devices via a serial or parallel data bus. The present invention will be described with reference to a microprocessor coupled to a memory device via a parallel data bus, it being understood that the present invention should not be limited thereto. The term device (e.g., microprocessors, memory, FETs, etc.) includes circuits of transistors coupled together to perform a function. As used herein, devices can be coupled together either directly, i.e., without any intervening device, or indirectly, with one or more intervening devices. As used herein the term connected devices means two or more devices directly connected together without any intervening circuit via one or more conductors. The term coupled includes the term connected within its definition.

Figure 4:
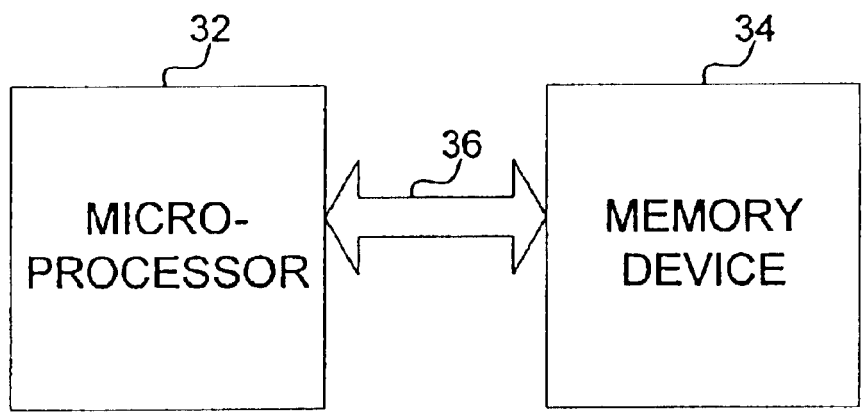
FIG. 4 is a block diagram of a microprocessor coupled to a memory device via a data bus.

FIG. 4 is a block diagram of a microprocessor 32 coupled to memory device 34 via a data bus 36. Although not shown, data bus 36 includes a plurality of conductive lines coupled between microprocessor 32 and memory device 34. Microprocessor 32 includes a plurality of IO devices (not shown in FIG. 4) coupled to respective conductive lines of data bus 14.

Figure 5:
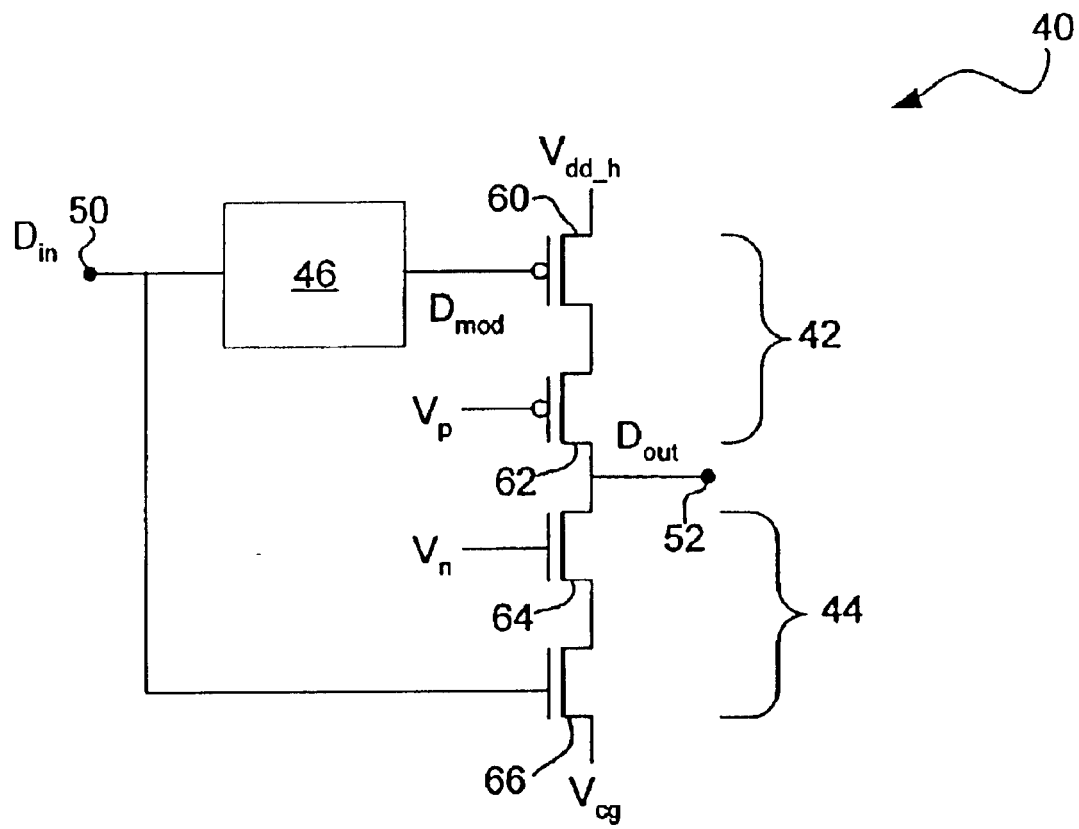
FIG. 5 is a schematic diagram of one embodiment of a driver contained in an IO device of the microprocessor of FIG. 4.

FIG. 5 shows a schematic diagram of an exemplary driver 40 that may be used in one or more of the IO devices of microprocessor 32. Driver 40 drives one of the conductive lines of data bus 36 in response to receiving an input data bit signal. Driver 40 includes a pull-up stage circuit 42, pull-down stage circuit 44, and a voltage level converter circuit 46. The operational aspects of circuit 46 will be more fully described below. Lastly, driver 40 includes an input node 50 and an output node 52. Although not shown, output node 52 is coupled to one of the conductive lines of data bus 36.

Pull-up stage 42 includes a pair of p-channel FETs 60 and 62, while pull-down stage 44 includes a pair of n-channel FETs 64 and 66. The source of p-channel FET 60 is coupled to $V_{dd-h}$ while the gate of p-channel FET 60 is coupled to the output of level converter circuit 46. $V_{dd-h}$ is a supply voltage. The source of p-channel FET 62 is coupled to the drain of p-channel FET 60, while the gate of p-channel FET 62 is coupled to a direct current (DC) voltage $V_p$. The drains of p-channel FET 62 and n-channel FET 64 are coupled together and to output node 52. The source of n-channel FET 64 is coupled to the drain of n-channel FET 66. The source of n-channel FET 66 is coupled to $V_{cg}$. The gate of n-channel FET 64 is coupled to a DC voltage $V_n$. The gate of n-channel FET 66 is coupled to input node 50.

In operation, input node 50 receives an input data bit signal $D_{in}$ directly or indirectly from the core of microprocessor 32. Although not shown, $D_{in}$ is provided to input node 50 by an inverter gate or other circuit for inverting the binary state of a data bit signal. The input data bit signal $D_{in}$ varies between two voltage levels $V_{dd}$ or $V_{cg}$ representing a binary one or a binary zero, respectively. In response to receiving $D_{in}$, driver 40 charges or discharges output node 52 and the conductive line of data bus 36 coupled thereto. When driver 40 receives $D_{in}$ equal to $V_{cg}$, driver 40 drives or charges output node 52 to $V_{dd-h}$. When driver 40 receives $D_{in}$ equal to $V_{dd}$, driver 40 drives or discharges output node 52 to $V_{cg}$. In this manner, driver 40 generates an output data bit signal $D_{out}$ at output node 52 that varies between $V_{dd-h}$ and $V_{cg}$ in response to receiving input data bit signal $D_{in}$ that varies between $V_{dd}$ and $V_{cg}$.

It is noted that driver 40 may receive $D_{in}$ with voltage levels that vary between a voltage that is slightly lower than $V_{dd}$ and a voltage that is slightly higher than $V_{cg}$. Further, it is noted that driver 40 may charge output node 52 to a voltage slightly lower than $V_{dd-h}$ or discharge output node 52 to a voltage slightly greater than $V_{cg}$. However, for purposes of explanation, it will be presumed that $D_{in}$ varies between $V_{dd}$ and $V_{cg}$ and that driver 40 charges and discharges output node 52 to $V_{dd-h}$ and $V_{cg}$, respectively.

$V_{dd-h}$ and $V_{dd}$ are supply voltages. Each may be provided from one or more sources external to microprocessor 32. $V_{cg}$ is common ground or a voltage less than $V_{dd-h}$ and $V_{dd}$. $V_{dd-h}$ is greater than $V_{dd}$ and $V_{limit}$, the gate oxide voltage of devices 60–66. $V_{limit}$ is described in the background section above.

In one embodiment, $V_n$ is distinct from $V_p$. In another embodiment, $V_n$ and $V_p$ are the same. For purposes of explanation, $V_n$ is presumed distinct from $V_p$. In general $V_n$ and $V_p$ are subject to the following restrictions:

$$V_{limit} > V_p > V_{dd-h} - V_{limit} \quad (1)$$

$$V_{limit} > V_n > V_{dd-h} - V_{limit} \quad (2)$$

Voltage level converter circuit 46 is coupled to input node 50 and receives input data bit signal $D_{in}$ therefrom. In response to receiving $D_{in}$, converter circuit 46 generates a modified input data bit signal $D_{mod}$ that varies between voltages $V_{dd-h}$ and an intermediate voltage $V_{int}$ representing binary one and binary zero, respectively. $V_{int}$ is subject to the following limitations:

$$V_{dd-h} - V_t > V_{int} > V_{dd-h} - V_{limit} \quad (3)$$

Circuit 46 generates $D_{mod}$ equal to $V_{dd-h}$ in response to receiving $D_{in}$ equal to $V_{dd}$, and circuit 46 generates $D_{mod}$ equal to $V_{int}$ in response to receiving $D_{in}$ equal to $V_{cg}$.

Further operational aspects of driver 40 shown in FIG. 5 will be explained with reference to the timing diagram shown in FIG. 6. At time t=0, the voltage level of $D_{in}$ equals $V_{cg}$. With $D_{in}$ equal to $V_{cg}$, n-channel FET 66 is inactive thereby decoupling output node 52 from $V_{cg}$. Circuit 46 generates $D_{mod}$ equal to $V_{int}$ in response to receiving $D_{in}$ equal to $V_{cg}$. Because $V_{int} < V_{dd-h} - V_t$, p-channel FET 60 is active and charges the drain and source of p-channel FETs 60 and 62, respectively, to $V_{dd-h}$. With both the drain and source of p-channel FET 60 charged to $V_{dd-h}$ and with the constraints on $V_{int}$ imposed by equation (3) above, $V_{gs}$ and $V_{gd}$ of p-channel FET 60 are both less than $V_{limit}$, and p-channel FET 60 should not experience the damage described in the background section above.

As noted above, the source of p-channel FET 62 is charged to $V_{dd-h}$. $V_p$ is less than $V_{dd-h} - V_t$, and, as a result p-channel FET 62 activates. With p-channel FETs 60 and 62 active and with at least n-channel FET 66 inactive, output node 52, and thus the conductive line of data bus 36 coupled to output node 52, is charged to $V_{dd-h}$. Additionally, the drain of p-channel FET 62 and the drain of n-channel FET 64 are also charged to $V_{dd-h}$. With both the drain and source of p-channel FET 62 charged to $V_{dd-h}$ and with the constraints on $V_p$ imposed by equation (1) above, both $V_{gs}$ and $V_{gd}$ of p-channel FET 62 are less than $V_{limit}$, and p-channel FET 62 should not experience the damage described in the background section above.

As will be more fully described below, the source of n-channel FET 64 and the drain of n-channel FET 66 are charged to $V_n - V_t$. With the drain and source of n-channel FET 66 charged to $V_n - V_t$ and $V_{cg}$, respectively, with the gate of n-channel FET 66 at $V_{cg}$, and with the constraints on $V_n$ imposed by equation (2) above, both $V_{gs}$ and $V_{gd}$ of n-channel FET 66 are less than $V_{limit}$, and n-channel FET 66 should not experience the damage described in the background section above. Further, with the drain and source of n-channel FET 64 charged to $V_{dd-h}$ and $V_n - V_t$, respectively and with the constraints on $V_n$ imposed by equation (2) above, both $V_{gs}$ and $V_{gd}$ of n-channel FET 64 are less than $V_{limit}$, and n-channel FET 66 should not experience the damage described in the background section above.

Figure 6:
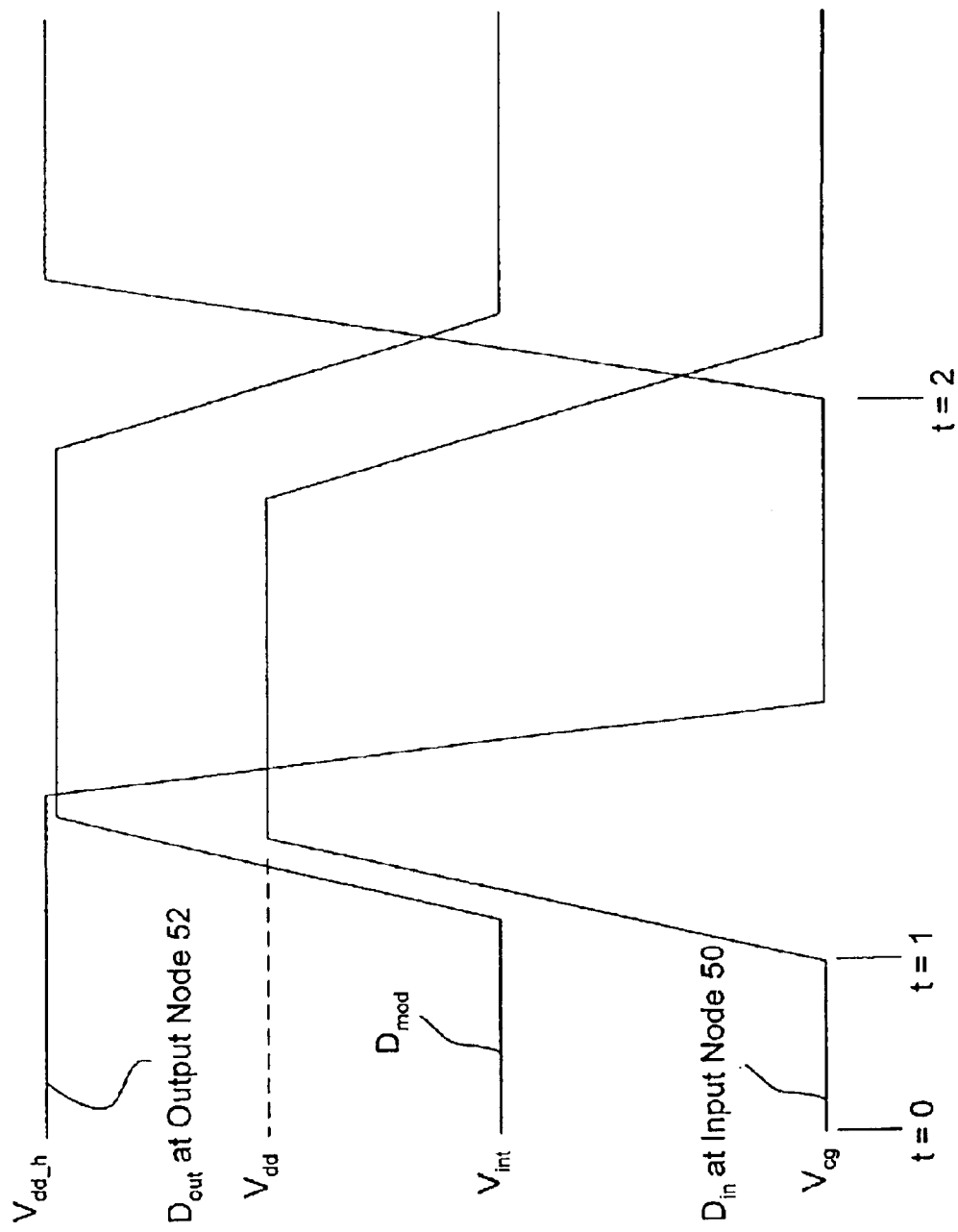
FIG. 6 is a timing diagram illustrating operational aspects of the driver shown in FIG. 5.

With continuing reference to FIGS. 5 and 6, at time $t=t_1$, $D_{in}$ changes to $V_{dd}$. In response shortly thereafter, $D_{mod}$ generated by circuit 42 changes to $V_{dd-h}$, which in turn deactivates p-channel FET 60. Output node 52 is disconnected from $V_{dd-h}$ when FET 60 deactivates. Also at time $t=t_1$, n-channel FET 66 activates in response to $D_{in}$ changing to $V_{dd}$ and FET 66 discharges the drain of n-channel FET 66 and the source of n-channel FET 64 to $V_{cg}$. With the source and drain of n-channel FET 66 at $V_{cg}$ and with the gate of n-channel FET 66 at $V_{dd}$, $V_{gs}$ and $V_{gd}$ of n-channel FET 66 are less than $V_{limit}$.

With the source voltage of n-channel FET 64 at $V_{cg}$ and with $V_n$ greater than $V_{cg} + V_t$, n-channel FET 64 activates. With n-channel FETs 64 and 66 active, and with p-channel FET 60 inactive as noted above, output node 52 discharges to $V_{cg}$. Additionally, the drains of n-channel FET 64 and the p-channel FET 62 discharge to $V_{cg}$. With the source and drain of n-channel FET 64 at $V_{cg}$, and with the constraints imposed on $V_n$ by equation (2), both $V_{gs}$ and $V_{gd}$ of n-channel FET 64 are less than $V_{limit}$, and n-channel FET 64 should not experience the damage described in the background section above.

As noted above, p-channel FET 60 is deactivated shortly after time $t=t_1$. While p-channel FET 62 is still activated and while p-channel FET 60 is deactivated, the source of p-channel FET 62, and thus the drain of p-channel FET 60, discharges until it reaches $V_p+V_t$. Once the source of p-channel FET 62 reaches $V_p+V_t$, p-channel FET 62 deactivates. At that point, and with the constraints on $V_p$ imposed by equation (1) above, both $V_{gs}$ and $V_{gd}$ of p-channel FETs 60 and 62 are less than $V_{limit}$.

At time $t=t_2$, $D_{in}$ changes back to $V_{cg}$, and in response n-channel FET 66 deactivates thereby disconnecting output node 52 from $V_{cg}$. Circuit 42, also in response to the change in $D_{in}$, generates $D_{mod}$ equal to $V_{int}$. With $D_{mod}$ equal to $V_{int}$, p-channel FET 60 again activates and the source of p-channel FET 62 is charged to $V_{dd-h}$. $V_p$ activates p-channel FET 62, and the drain of p-channel FET 62, the drain of n-channel FET 64 and output node 52 are charged to $V_{dd-h}$. N-channel FET 64 remains activated until its source is charged to $V_n+V_t$. When the source of n-channel FET 64 reaches $V_n+V_t$, n-channel FET 64 is deactivated. The voltages at the nodes of FETs 60–66 return to the state they were shortly after time $t=t_0$, at which point $V_{gs}$ and $V_{gd}$ of the FETs 60–66 do not exceed $V_{limit}$.

Figure 7:
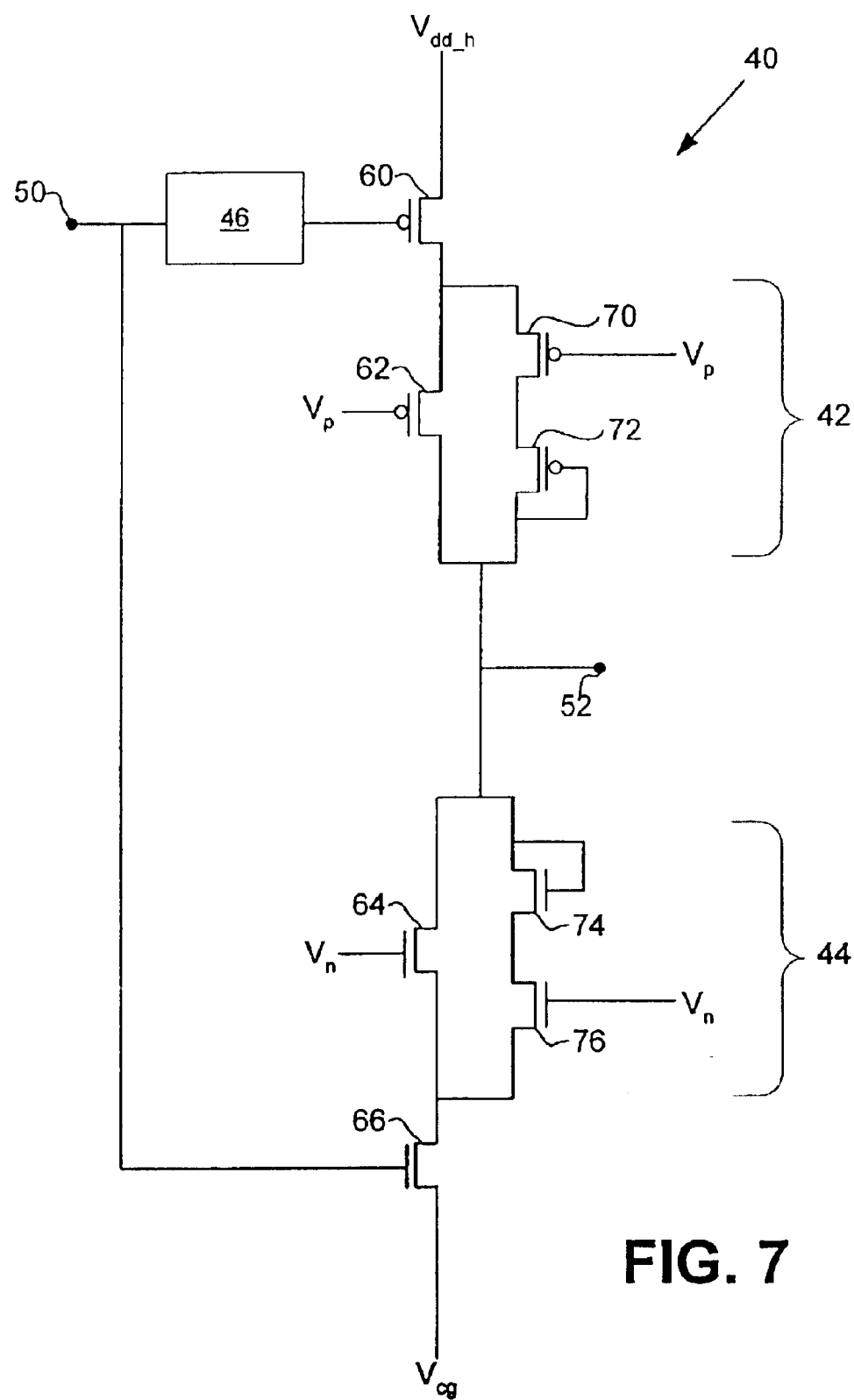
FIG. 7 is a schematic diagram of another embodiment of a driver contained in an IO device of the microprocessor of FIG. 4.
Figure 8:
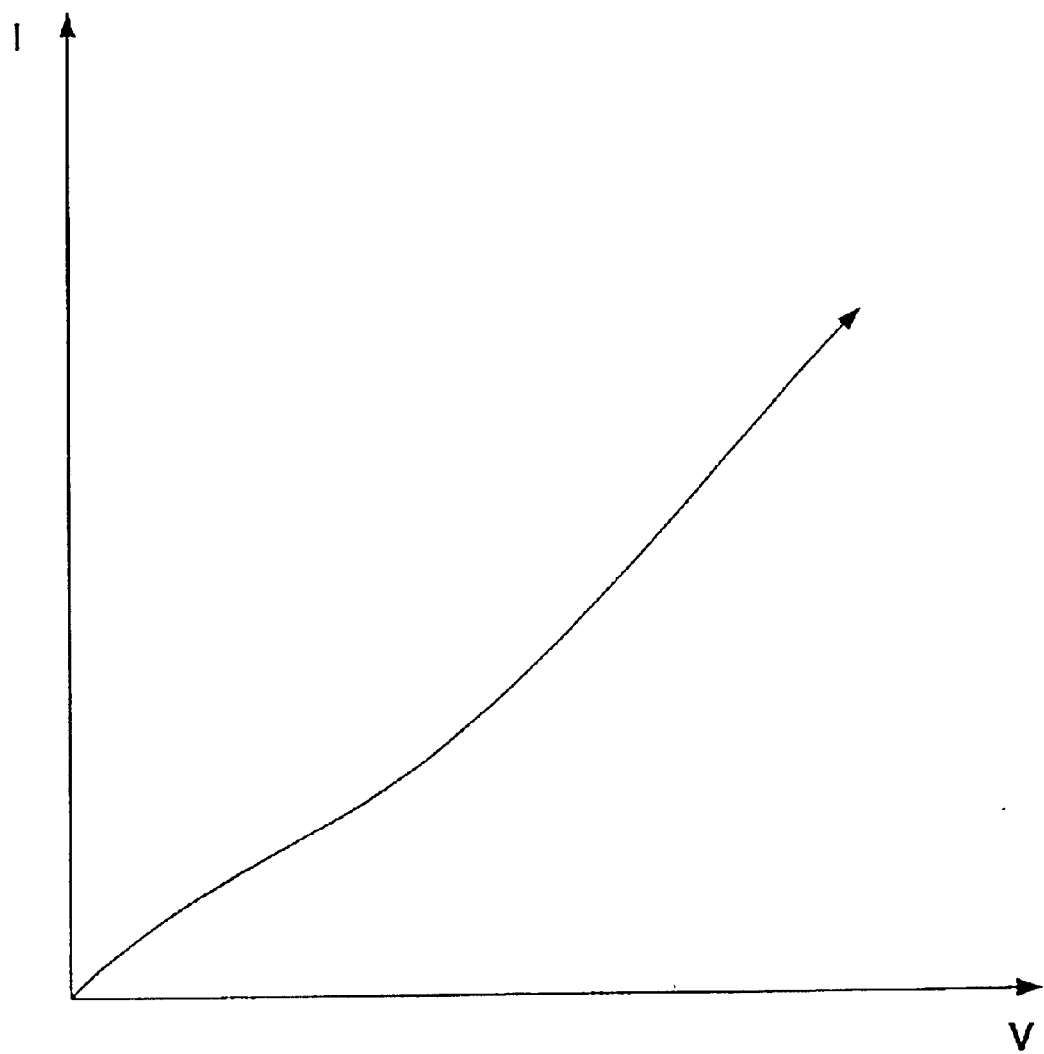
FIG. 8 is an IV curve representing the output impedance characteristics of the driver shown in FIG. 7.

Driver 40 charges or discharges output node 52, and thus the conductive line of data bus 36 and the memory device 34 coupled thereto, in accordance with the input data bit signal $D_{in}$. Driver 40 is similar to driver 16 described above, in that the output impedance of driver 40 varies with its output voltage, temperature, and/or magnitude of $V_{dd-h}$. In other words, the IV characteristics of driver 40 are similar to that shown in FIG. 4. The non-linearity of driver 40 output impedance can be improved. FIG. 7 shows driver 40 of FIG. 5 with p-channel FETs 70 and 72, and n-channel FETs 74 and 76 added to pull-up stage 42 and pull-down stage 44, respectively. More particularly p-channel FETs 70 and 72 are connected in series, and the combination of p-channel FETs 70 and 72 is coupled in parallel with p-channel FET 62. Likewise, n-channel FETs 74 and 76 are connected in series, and the combination of n-channel FETs 74 and 76 is coupled in parallel with n-channel FET 64. The combination of p-channel FETs 70 and 72 and n-channel FETs 74 and 76 represent one embodiment of a circuit for improving the linearity of the output impedance of a driver including driver 40 shown in FIG. 5. FIG. 8 illustrates an IV curve that characterizes the output impedance of driver 40 of FIG. 7 operating at constant temperature and $V_{dd-h}$ magnitude. As can be seen in FIG. 8, the current I generated by driver 40 varies linearly or substantially linearly with voltage V at output node 52. The increased linear relationship exists for at least a predetermined range of driver 40 output voltages V. Because I varies linearly or in a substantial linear relationship with V, the output impedance of driver 40 shown in FIG. 7 is substantially constant as output voltage V varies. The illustration of FIG. 8 presumes that no load is applied to output node 52.

Figure 2:
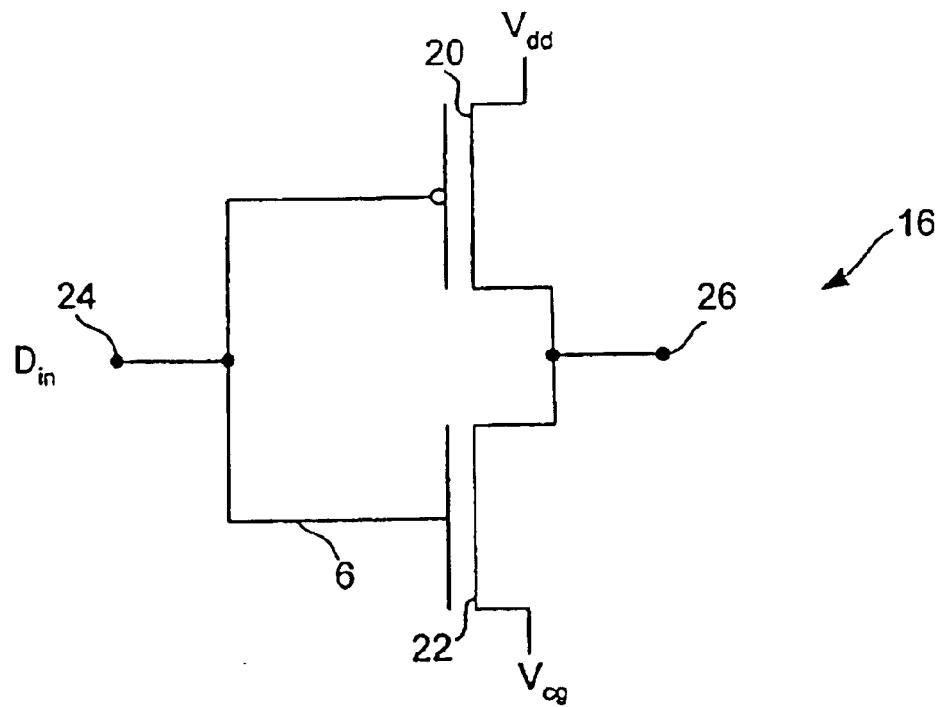
FIG. 2 is a schematic diagram of a driver contained in an IO device of the microprocessor of FIG. 1.

The output impedance of driver 40 of FIG. 7 is proportional to the slope of the IV curve shown in FIG. 8. The slope of the IV curve is dependent on the sizes of the FETs 60–66 and 70–76. Computer simulation can be used to calculate the output impedance of driver 40 shown in FIG. 7. More particularly, computer simulation can be used to adjust the sizes of FETs 60–66 and 70–76 so that the output impedance of driver 40 is made to match or substantially match the combined impedance of the memory device and the conductive line coupled to output node 52. With FETs 60–66 and 70–76 properly sized, the output impedance of driver 40 equals or substantially equals the combined impedance of memory device 34 and the conductive line coupled to output node 52, and driver 40 should not experience the same degradation or limitation of abilities to transmit data bit signals as would be expected by driver 16 of FIG. 2 or driver 40 of FIG. 5.

Figure 9:
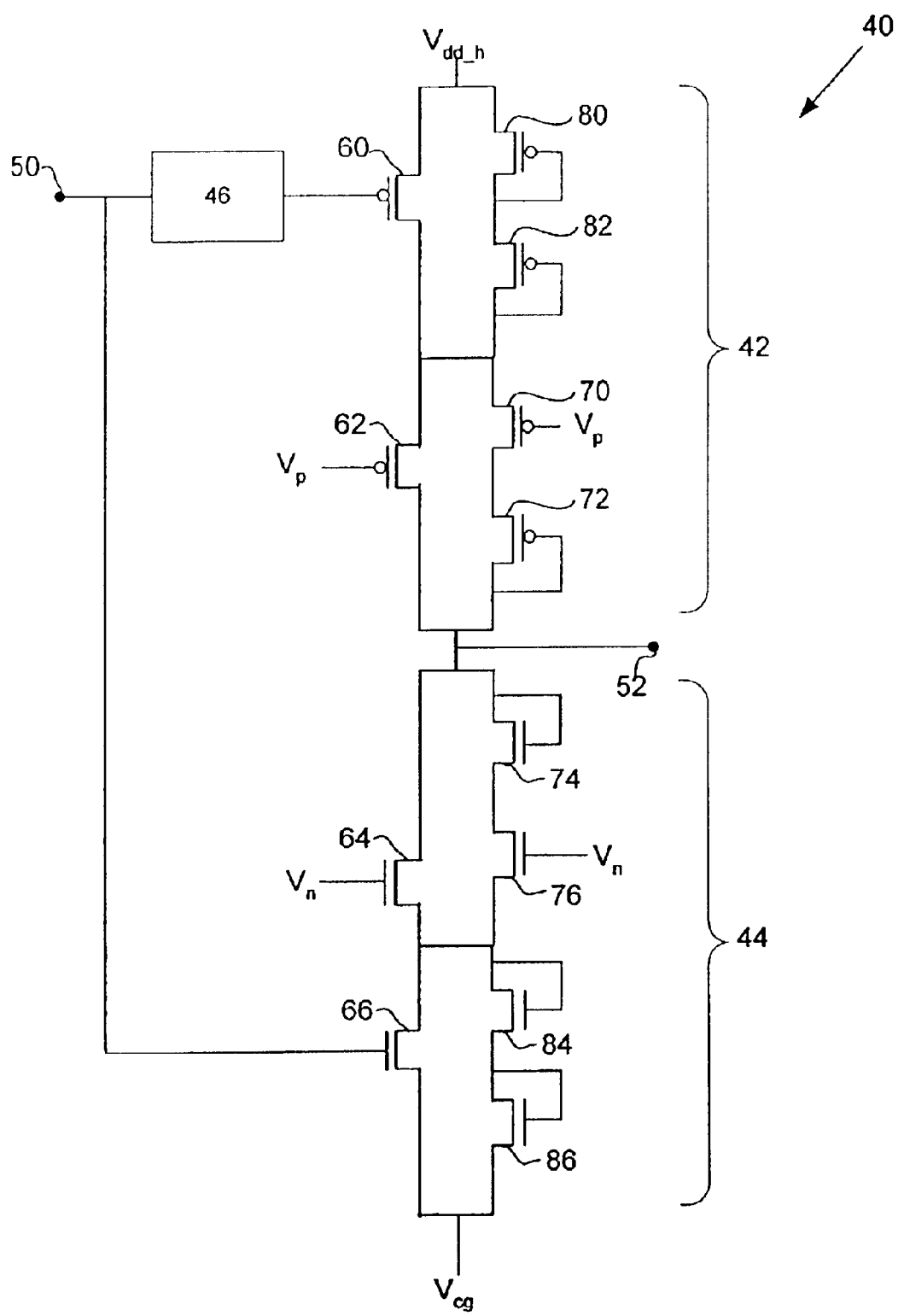
FIG. 9 is a schematic diagram of another embodiment of a driver contained in an IO device of the microprocessor of FIG. 4.

FIG. 9 illustrates an extension of the driver 40 shown in FIG. 7. More particularly, FIG. 9 shows the driver 40 of FIG. 7 along with diode connected p-channel FETs 80 and 82, and diode connected n-channel FETs 84 and 86 added to pull-up circuit 42 and pull-down circuit 44, respectively. Diode connected p-channel FETs 80 and 82 are substantially smaller in size when compared to p-channel FET 60, and diode connected n-channel FETs 84 and 86 are substantially smaller in size when compared to n-channel FET 66 such that the amount of current passed by FETs 80–86 is substantially smaller than the current passed by devices 60 and 66 when active.

Diode connected p-channel FETs 80 and 82 and diode connected n-channel FETs 84 and 86 operate to protect devices 60 and 66, respectively. Capacitance coupling or other mechanisms may cause the voltage at the common node between FETs 60 and 62 to fall below $V_{dd-h}$ by more than $V_{limit}$. Diode connected p-channel FETs 80 and 82 allow a small current to charge this common node thus ensuring the voltage at the common node doesn't fall more than $V_{limit}$ below $V_{dd-h}$. Likewise, capacitance coupling or other mechanisms may cause the voltage at the common node between FETs 64 and 66 to increase beyond $V_{limit}$. Diode connected n-channel FETs 84 and 86 allow a small current to discharge the common node between FETs 64 and 66 thus ensuring the voltage at this node doesn't beyond $V_{limit}$. It is noted that a single diode connected p-channel FET between $V_{dd-h}$ and the common node between FETs 60 and 62 may also ensure that the voltage at this node does not fall more than $V_{limit}$ below $V_{dd-h}$, and that a single diode connected n-channel FET between $V_{cg}$ and the common node between FETs 64 and 66 may also ensure that the voltage at this node does not beyond $V_{limit}$.

Figure 10:
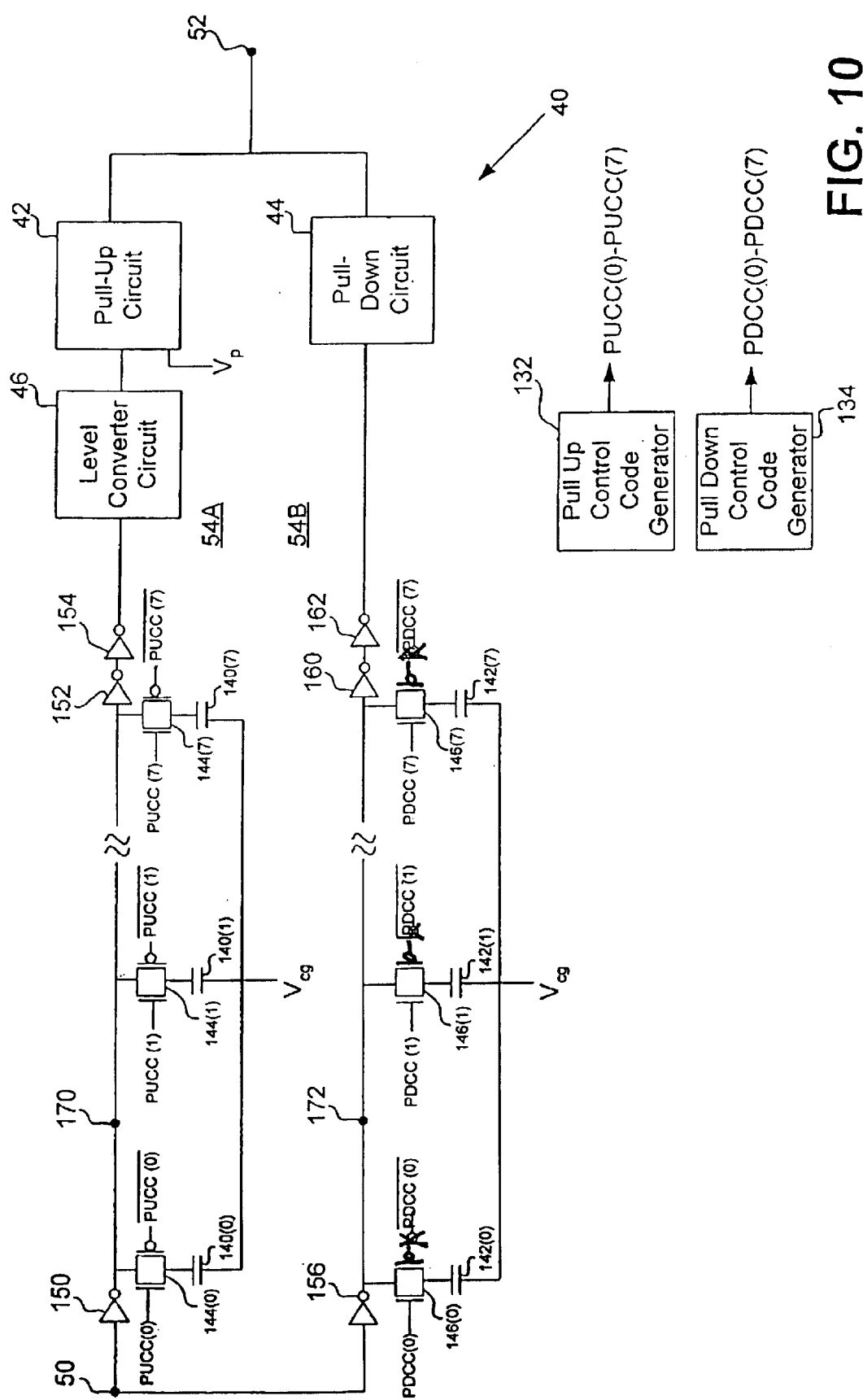
FIG. 10 illustrates another embodiment of a driver contained in the IO device of microprocessor of FIG. 4.

FIG. 10 illustrates another driver 40 that may be employed in the microprocessor 32 shown in FIG. 4. FIG. 10 also shows a pull-up control code generator 132 and a pull-down control code generator 134. Driver 40 shown in FIG. 10 includes any of the pull-up circuits 42 and/or any of the pull-down circuits 44 illustrated in FIG. 5, 7, or 9. Additionally, driver 40 shown in FIG. 10 includes pull-up capacitors 140(0)–140(7), pull-down capacitors 142(0)–142(7), pull-up switches 144(0)–144(7), pull-down switches 146(0)–146(7), and inverting buffers 150 through 162. Although not shown, it is noted that additional components may be included within the driver 40 shown in FIG. 10.

Driver 40 shown in FIG. 10 will be described as having eight pull-up capacitors 140(0)–140(7), eight pull-down capacitors 142(0)–142(7), eight pull-up switches 144(0)–144(7), and eight pull-down switches 146(0)–146(7). It is noted that a larger or smaller number of capacitors and switches may be employed in driver 40 of FIG. 10. It is also noted that, unlike drivers 40 shown in FIGS. 5, 7, and 9, $D_{in}$ is not provided to driver 40 of FIG. 10 by an inverter or other circuit for inverting the state of a data bit signal.

Each of the pull-up and pull-down capacitors is coupled between $V_{cg}$ and a respective switch. For example, pull-up capacitors 140(0) is coupled between switch 144(0) and $V_{cg}$, and pull-down capacitor 142(0) is coupled between switch 146(0) and $V_{cg}$. The size of pull-up and pull-down capacitors may vary. For example, each of pull-up capacitors 140(0)–140(7) may be different from each other in capacitive size, and each of pull-down capacitors 142(0)–142(7) may be different from each other in capacitive size. Alternatively, the sizes of pull-up and pull-down capacitors may be identical.

Pull-up switches 144(0)–144(7) and pull-down switches 146(0)–146(7) may take form in one or more FETs. In the embodiment shown, each of the pull-up switches 144(0)–144(7) and pull-down switches 146(0)–146(7) take form in an n-channel FET and a p-channel FET coupled in parallel between a respective capacitor and node 170 or node 172. The gates of the FETS of pull-up switch FETs 144(0)–144(7) are coupled to pull-up control code generator 132, and the gates of the FETs of the pull-down switch FETs 146(0)–146(7) are coupled to the pull-down control code generator 134. Pull-up control code generator 132 and pull-down control code generator 134 generate a multibit pull-up control code (PUCC(0)–PUCC(7)) and a multibit pull-down control code (PDCC(0)–PDCC(7)), respectively. The n-channel FETs of pull-up switches 144(0) through 144(7) are controlled by PUCC(0)–PUCC(7), respectively, the p-channel FETs of pull-up switches 144(0) through 144(7) are controlled by the inverse of PUCC(0)–PUCC(7), respectively, the n-channel FETs of pull-down switches 146(0) through 146(7) are controlled by PDCC(0)–PDCC(7), respectively, and the p-channel FETs of pull-down switches 146(0) through 146(7) are controlled by the inverse of PDCC(0)–PDCC(7), respectively. At any point in operation of driver 40 shown in FIG. 10, none, some or all of pull-up switches 144(0)–144(7) may be closed in response to receiving PUCC(0)–PUCC(7) (and its inverse) from pull-up control code generator 132. Likewise, at any point in time in the operation of driver 40 shown in FIG. 10, none, some, or all of the switches 146(0)–146(7) may be closed in response to receiving PDCC(0)–PDCC(7) (and its inverse) provided by the pull-down control code generator 134.

Pull-up control code generator 132 and pull-down control code generator 134 each generate the pull-up control code PUCC(0)–PUCC(7) and pull-down control code PDCC(0)–PDCC(7), respectively, in response to comparing an output impedance of a driver, such as driver 40 shown in FIG. 11A (more fully described below), against a known impedance. The output impedance of this driver is controlled by the pull-up and pull-down control codes such that when the pull-up control code PUCC(0)–PUCC(7) increases (e.g., from 00000011 to 00000111), the output impedance of the driver decreases and vice-versa, and when the pull-down control code decreases (e.g., from 01111111 to 00111111), the output impedance of the driver decreases and vice-versa. The pull-up and pull-down control codes are adjusted until the output impedance of the driver compares substantially equal to the know impedance. If the output impedance of the driver increases or decreases due to variations in, for example, power supply voltage $V_{dd-h}$ provided to the driver or temperature T of the driver, then the pull-up and/or pull-down control codes adjust accordingly. It is noted that PUCC(0)–PUCC(7) may be distinct from PDCC(0)–PDCC(7) at any point in time. U.S. Pat. No. 6,060,907 describes embodiments of pull-up control code generator 132 and/or pull-down control code generator 134, and is incorporated herein by reference in its entirety.

Inverting buffers 150 through 154 are coupled between input node 50 and level converter circuit 46. Likewise, inverting buffers 156 through 162 are coupled between input node 50 and pull-down circuit 44. Switches 144(0)–144(7) are coupled to node 170 between inverting buffers 150 and 152 as shown in FIG. 10. Likewise, switches 146(0)–146(7) are coupled to node 172 between inverting buffers 156 and 160. The transmission delay of signals between inverters 150 and 152 depends on the number of capacitors 140(0)–140(7) coupled to node 170 via respective switches 144(0)–144(7), respectively. Likewise, the transmission delay of signals between inverting buffers 156 and 160 depends upon the number of capacitors 142(0) through 142(7) coupled to the transmission path between inverting buffers 156 and 160 via switches 146(0) through 146(7), respectively.

As noted above, pull-up control code generator 132 and pull-down control code generator 134 generate PUCC(0)–PUCC(7) and PDCC(0)–PDCC(7), respectively, based indirectly upon T and/or $V_{dd-h}$. PUCC(0)–PUCC(7) and PDCC(0)–PDCC(7) are generated to ensure that driver 40 of FIG. 10 charges or discharges output node 52 during predetermined timing windows defined by the specifications for data bus 36. For example, if the temperature T increases beyond a predetermined temperature, the time it takes pull-up circuit 42 and pull-down circuit 44 to fully charge or discharge output node 52 in response to receiving $D_{in}$, will be delayed when compared to the time it takes pull-up circuit 42 and pull-down circuit 44 to fully charge or discharge output node 52 when T equals the predetermined temperature. With the temperature T greater than the predetermined value, pull-up control code generator 132 and pull-down control code generator 134 may generate PUCC(0)–PUCC(7) and PDCC(0)–PDCC(7), respectively, which opens one or more switches 144(0)–144(7) and 146(0)–146(7) to offset the delay caused by the increased temperature T.

Figure 3:
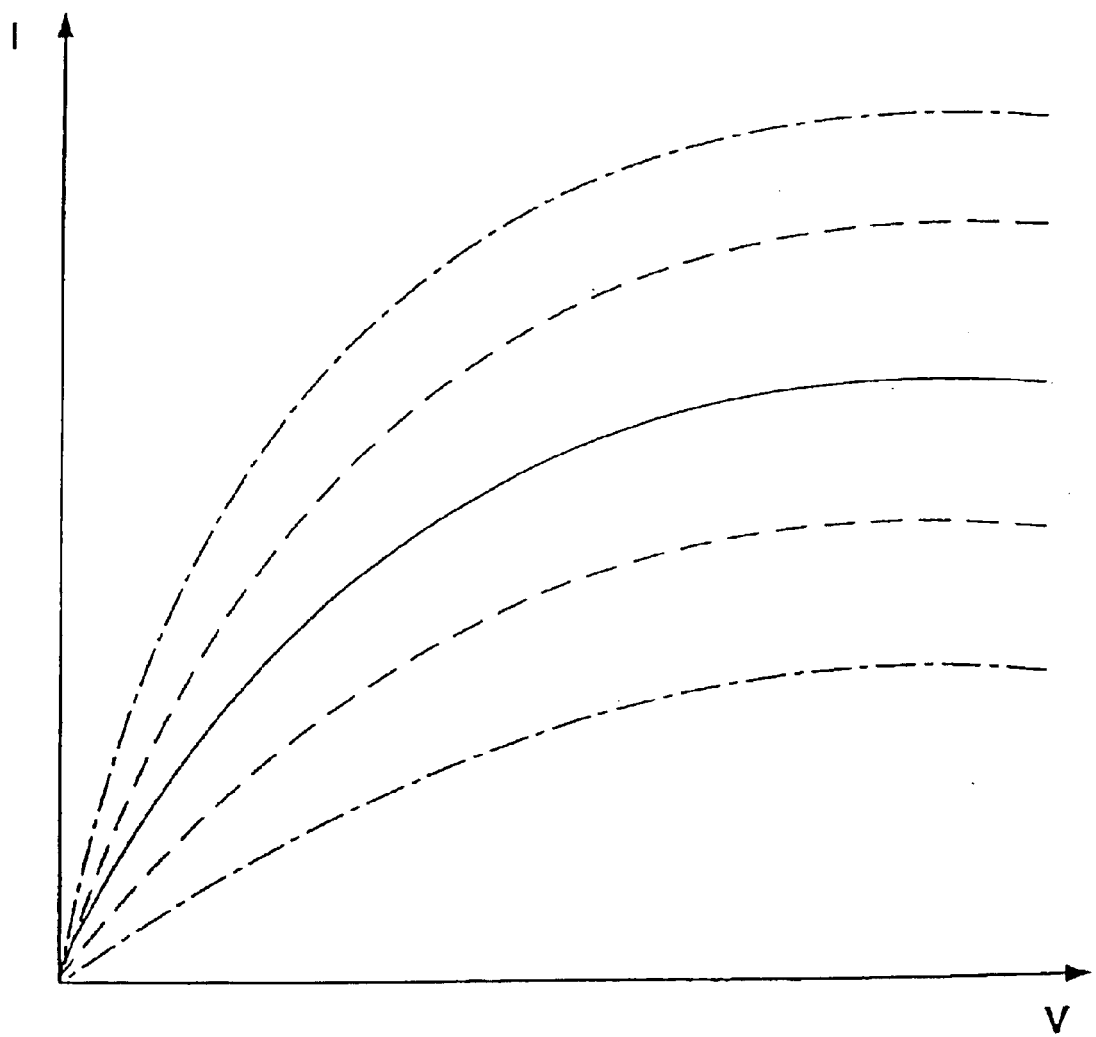
FIG. 3 illustrates IV curves of the driver shown in FIG. 2.

As noted in its background section, the output impedance of driver 16 shown in FIG. 3 is subject to unexpected variations due to changes in temperature during operation and/or changes in the magnitude of supply voltage $V_{dd}$. Additionally, as noted above, the actual output impedance of driver 16 operating at a predetermined temperature and magnitude of $V_{dd-h}$ may not match the expected output impedance of driver due to unexpected variations in the physical structure of FETs 20 and 22 which occurred during the manufacturing process. The output impedance of driver 40 shown in FIGS. 5, 7, 9, and 10 is also subject to these variations. FIG. 11A illustrates another embodiment of driver 40 that may be employed in the microprocessor 32 of FIG. 4. Driver 40 has the capability to dynamically change its output impedance.

Figure 11A:
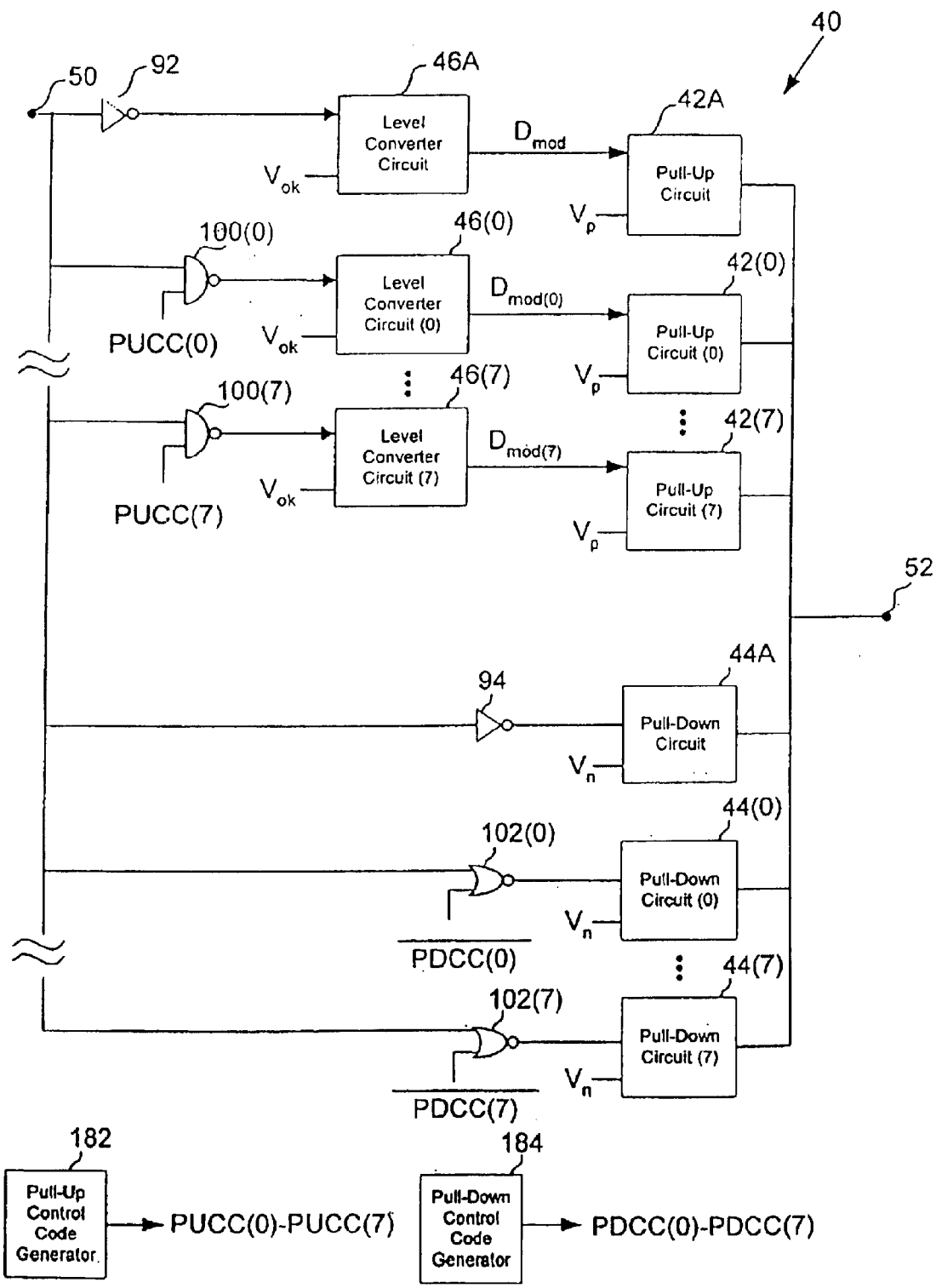
FIG. 11A illustrates another embodiment of a driver contained in the IO device of microprocessor of FIG. 4.

Driver 40 shown in FIG. 11A includes a plurality of pull-up circuits 42A and 42(0)–42(7), and a plurality of pull-down circuits 44A and 44(0)–44(7). Driver 40 of FIG. 11A also includes a plurality of level converter circuits 46A and 46(0)–46(7). Lastly, driver 40 of FIG. 11A includes a plurality of logic gates including inverters 92 and 94, nand gates 100(0)–100(7) and nor gates 102(0)–102(7). It is also noted that, unlike drivers 40 shown in FIGS. 5, 7, and 9, $D_{in}$ is provided to driver 40 of FIG. 11A without first passing through an inverter or other circuit for inverting the state of a data bit signal. FIG. 11A also shows pull-up control code generator 182 and pull-down control code generator 184, which will be more fully described below.

Each of the pull-up base circuits 42A and 42(0)–42(7) may take form in any of the pull-up circuits 42 shown in FIGS. 5, 7, and 9. Likewise, any of the pull-down circuits 44a and 44(0)–44(7) may take form in any of the pull-down circuits 44 shown in FIG. 5, 7, or 9. The level converter circuits 46A and 46(0)–46(7) operate in a manner substantially similar to the converter circuit 46 described in FIGS.

5, 7, and 9. A more detailed embodiment of the level converter circuit will be described below.

Nand gates 100(0)–100(7) are coupled to the pull-up control code generator 182 shown in FIG. 10, and configured to receive pull-up control code PUCC(0)–PUCC(7), respectively, therefrom. Each of the nand gates 100(0)–100(7) is also coupled to input node 50 and configured to receive the input data bit signal $D_{in}$. Nor gates 102(0)–102(7) are coupled to pull-down control code generator 184 shown in FIG. 10 and configured to receive the logical inverse of pull-down control code PDCC(0)–PDCC(7), respectively, therefrom. Nor gates 102(0)–102(7) are also coupled to input node 50 and configured to receive input data bit signal $D_{in}$.

Inverters 92 and 94 are coupled to input node 50 and configured to receive data bit signal $D_{in}$. The output of inverter 92 is received by level converter circuit 46A. The output of inverter 94 is received by pull-down circuit 44A. The outputs of pull-up circuits 42A and 44(0)–42(7) and pull-down circuits 44A and 44(0)–44(7) are coupled to output node 52.

In operation, driver 40 shown in FIG. 11A charges or discharges output node 52, and any data bus transmission line or memory device coupled thereto, to $V_{dd\text{---}h}$ or $V_{cg}$, respectively, in response to input node 50 receiving input data bit signal $D_{in}$ that varies between $V_{dd}$ and $V_{cg}$. Pull-up control code generator 182 selectively enables one or more of the pull-up circuits 42(0)–42(7) and level converters 46(0)–46(7) via nand gates 100(0)–100(7). It is noted that in the embodiment shown, pull-up circuit 42A and level converter 46A are permanently enabled. However, driver 40 of FIG. 11A could be modified so that pull-up circuit 42A and level converter 46A are also selectively enabled.

When enabled, level converters 46A and 46(0)–46(7) generate $D_{mod}$ equal to $V_{dd\text{---}h}$ or $V_{int}$ when $D_{in}$ equals $V_{cg}$ and $V_{dd}$, respectively. When disabled, level converters 46(0)–46(7) generate $D_{mod}$ equal to $V_{dd\text{---}h}$ regardless of $D_{in}$. When enabled, pull-up circuits 42A and 42(0)–42(7) operate in the active or inactive state when $D_{mod}$ equals $V_{int}$ or $V_{dd\text{---}h}$, respectively. When active, each pull-up circuit drives output node 52 to $V_{dd\text{---}h}$. When inactive, each pull-up circuit is incapable of driving output node 52. When disabled, each of the pull-circuits 42(0)–42(7) operates only in the inactive state.

Pull-up control code bits PUCC(0)–PUCC(7) equal $V_{dd}$ or $V_{cg}$ representing a logical one or logical zero, respectively. As will be appreciated by one of ordinary skill in the art, pull-up circuits 42(0)–42(7) and corresponding level converters 46(0)–46(7) will be enabled when respective nand gates 100(0)–100(7) receive a pull-up control code bit that equals $V_{dd}$.

Pull-down control code generator 184 selectively enables one or more of the pull-down circuits 44(0)–44(7) via nor gates 102(0)–102(7). It is noted that in the embodiment shown, pull-down circuit 44A is permanently enabled. However, driver 40 of FIG. 11A could be modified so that pull-down circuit 44A is also selectively enabled.

When enabled, pull-down circuits 44A and 44(0)–44(7) operate in the active or inactive state when $D_{in}$ equals $V_{dd}$ or $V_{cg}$, respectively. When active, each pull-down circuit drives output node 52 to $V_{cg}$. When inactive, each pull-down circuit is incapable of driving output node 52. When disabled, each of the pull-down circuits 44(0)–44(7) operates only in the inactive state.

Pull-down control code bits PDCC(0)–PDCC(7) equal $V_{dd}$ or $V_{cg}$ representing a logical one or logical zero, respectively. As will be appreciated by one of ordinary skill in the art, pull-down circuits 44(0)–44(7) will be enabled when respective nor gates 102(0)–102(7) receive a pull-down control code bit that equals $V_{cg}$.

As noted above, parameters of driver 40 may change during operation thereof. For example, the operating temperature of driver 40 may increase or decrease from a predetermined value, or the magnitude of supply voltage $V_{dd\text{---}h}$ may increase or decrease from a predetermined value. A change in operating parameters may affect the output impedance of driver 40. Additionally, as noted above, unexpected physical variations in the FETs of driver 40 may affect its output impedance.

Figure 11B:
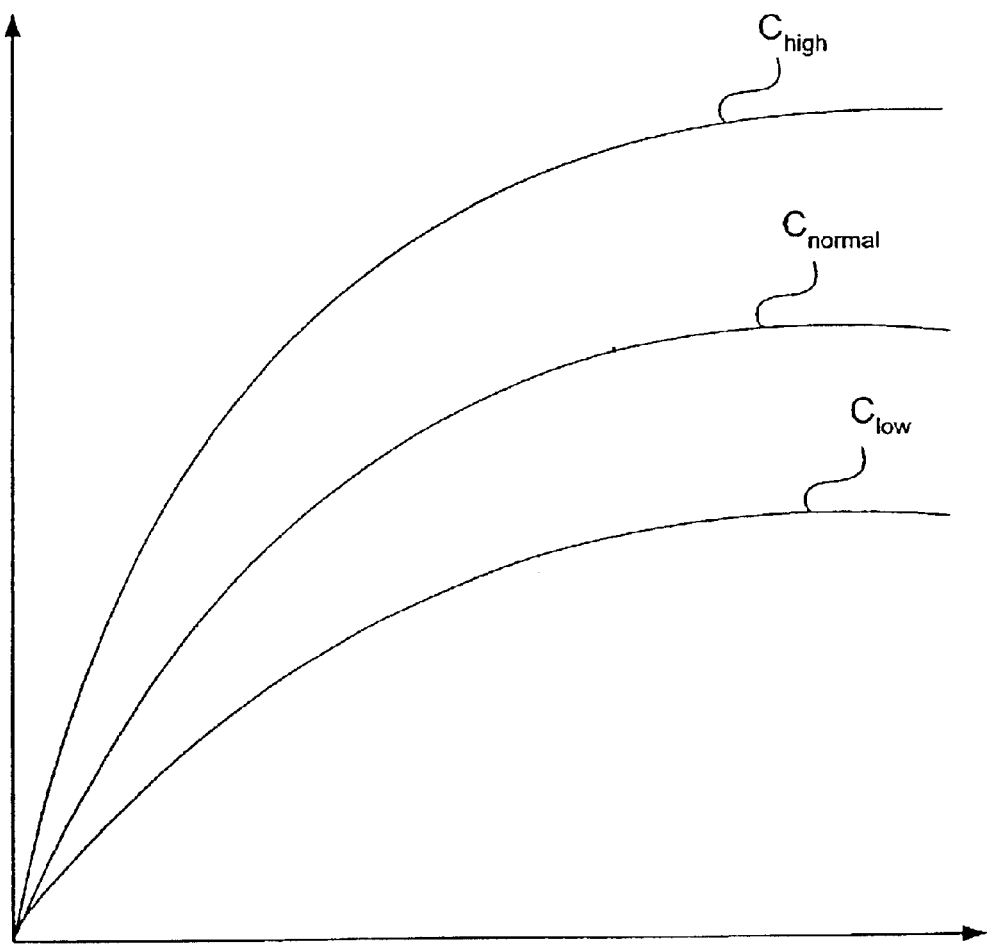
FIG. 11B illustrates IV curves representing the output impedance characteristics of the driver shown in FIG. 11A employing the pull-up and pull-down circuits of FIG. 5.
Figure 11C:
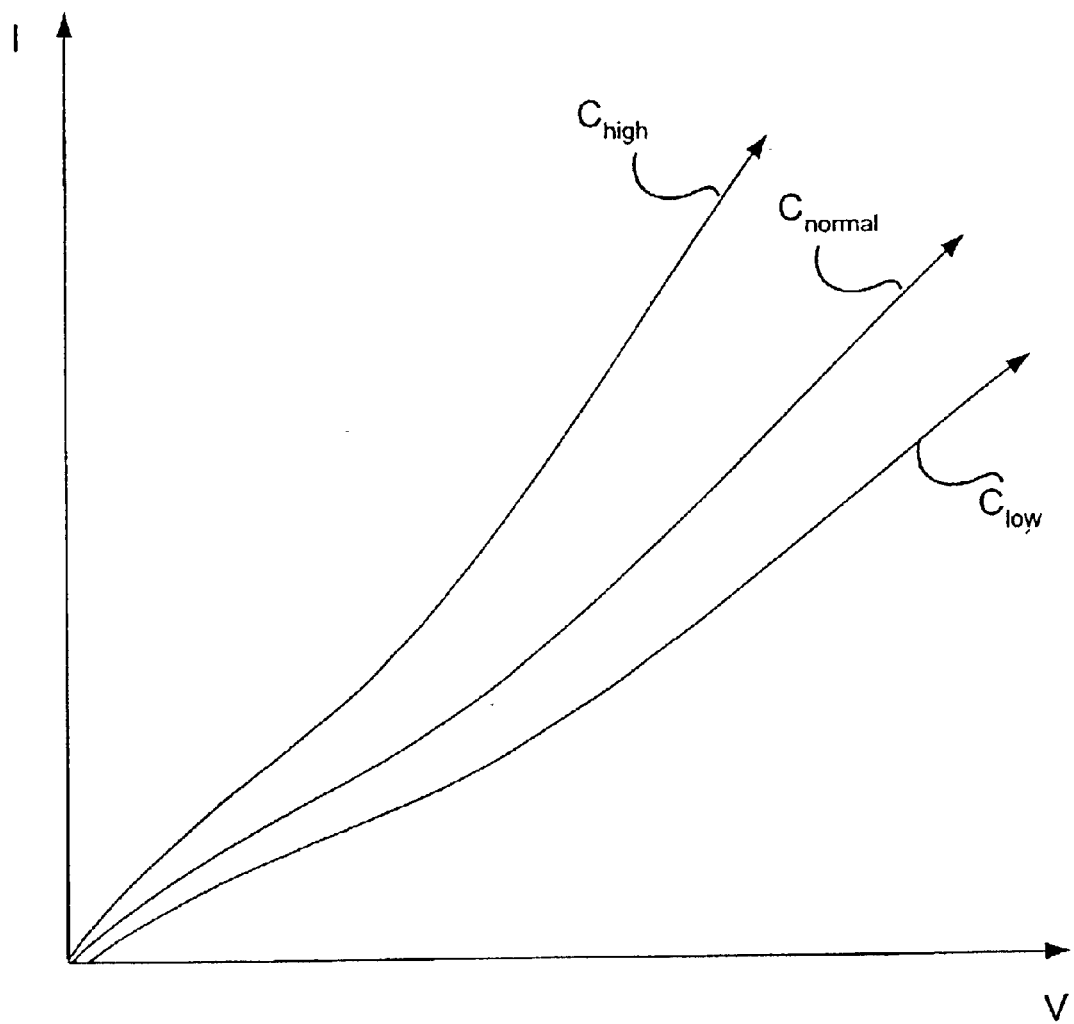
FIG. 11C illustrates IV curves representing the output impedance characteristics of the driver shown in FIG. 11A employing the pull-up and pull-down circuits of FIGS. 7 and 9.

FIG. 11B shows IV Curves $C_{normal}$, $C_{high}$ and $C_{low}$ representing output impedance of the driver 40 shown in FIG. 11A when pull-up circuits 42A and 42(0)–42(7) take form in the pull-up circuit 42 shown in FIG. 5 and when pull-down circuits 44A and 44(0)–44(7) take form in the pull-down circuit 44 also shown in FIG. 5. FIG. 11C shows IV curves $C_{normal}$, $C_{high}$ and $C_{low}$ illustrating output impedance of the driver 40 shown in FIG. 11A when pull-up circuits 42A and 42(0)–42(7) take form in the pull-up circuit 42 shown in FIG. 7 or 9, and when pull-down circuits 44A and 44(0)–44(7) take form in the pull-down circuit 44 also shown in FIG. 7 or 9. As noted above, temperature, magnitude of $V_{dd\text{---}h}$, and/or unexpected physical variations in the FETs may affect the expected output impedance of driver 40. $C_{normal}$ represents the expected output impedance of driver 40 of FIG. 10 with driver 40 operating at a predetermined temperature, with $V_{dd\text{---}h}$ provided at a predetermined magnitude, and with the FETs of driver 40 manufactured without unexpected physical variations. Driver 40 produces output impedance represented by $C_{normal}$ in response to receiving a first PUCC(0)–PUCC(7) and a first PUCC(0)–PDCC(7) generated by pull-control code generator 182 and pull-down control code generator 184, respectively.

$C_{high}$ represents the output impedance of driver 40 with the operating temperature of driver 40 below a predetermined value, with the magnitude of supply voltage $V_{dd\text{---}h}$ above a predetermined value, and/or with unexpected physical variations in the FETs of Driver 40. $C_{low}$ represents the output impedance of driver 40 with the operating temperature of driver 40 above a predetermined value, with the magnitude of supply voltage $V_{dd\text{---}h}$ below a predetermined value, and/or with unexpected physical variations in the FETs of Driver 40. $C_{high}$ and $C_{low}$ also result when the first PUCC(0)–PUCC(7) and the first PDCC(0)–PDCC(7) are provided to driver 40 of FIG. 11A.

As noted above, driver 40 of FIG. 11A is coupled to the pull-up control code generator 182 and the pull-down control code generator 184. In one embodiment, pull-up control code generator 182 and the pull-down control code generator 184 may operate similar to the pull-up control code generator 132 and the pull-down control code generator 134, respectively, described in FIG. 10. Indeed, as an alternative embodiment, driver 40 of FIG. 11A may be coupled to pull-up control code generator 132 and the pull-down control code generator 134.

Pull-up control code generator 182 and pull-down control code generator 184 directly or indirectly monitor the output impedance of driver 40. Should the output impedance of driver 40 deviate from that defined by $C_{normal}$ due to changes in operating temperature of driver 40 and/or changes in magnitude of $V_{dd\text{---}h}$, pull-up control code generator 182 and/or pull-down control code generator 184 may generate new PUCC(0)–PUCC(7) and PDCC(0)–PDCC(7), respectively. For example, the output impedance of driver 40 shown in FIG. 11A may drift down to that represented by $C_{low}$ as a result of an increase in operating temperature and/or a decrease in the magnitude of supply voltage $V_{dd-h}$. In response, pull-up control code generator 182 and/or pull-down control code generator 184 may generate new PUCC and/or PDCC, respectively. The new PUCC and/or PDCC may enable and/or disable one or more of the pull-up circuits 42(0)–42(7) and/or pull-down circuits 44(0)–44(7) to increase the output impedance to that defined by $C_{normal}$. Similarly, output impedance of driver 40 shown in FIG. 11A may drift up to that defined by $C_{high}$ as a result of a decrease in operating temperature T and/or an increase in the magnitude of supply voltage $V_{dd-h}$. In response, pull-up control code generator 182 and/or pull-down control code generator 184 may generate new PUCC(0)–PUCC(7) and/or PDCC(0)–PDCC(7), respectively that enable and/or disable one or more of the pull-up circuits 42(0)–42(7) and/or pull-down circuits 44(0)–44(7) to decrease the output impedance to that represented by $C_{normal}$.

Pull-up circuits 42A and 42(0)–42(7) are distinct from each other in one embodiment. For example, pull-up circuit 42A may have higher drive strength when compared to pull-up circuits 42(0)–42(7). Pull-up circuit 42A may include FETs 60 and 62 that are larger in size when compared to the FETs 60 and 62 of pull-up circuits 42(0)–42(7). Pull-up circuits 42(0)–42(7) may vary in their drive strengths from pull-up circuit 42(0) having relatively high drive strength to pull-up circuit 42(7) having relatively low drive strength.

Likewise, pull-down circuits 44A and 44(0)–44(7) are distinct from each other in one embodiment. For example, pull-down circuit 44A may have a higher drive strength when compared to pull-down circuits 44(0)–44(7). Pull-down circuit 44A may include FETs 64 and 66 that are larger in size when compared to the FETs 64 and 66 of pull-down circuits 44(0)–44(7). Pull-down circuits 44(0)–44(7) may vary in their drive strengths from pull-down circuit 44(0) having relatively high drive strength to pull-down circuit 44(7) having relatively low drive strength.

Figure 12:
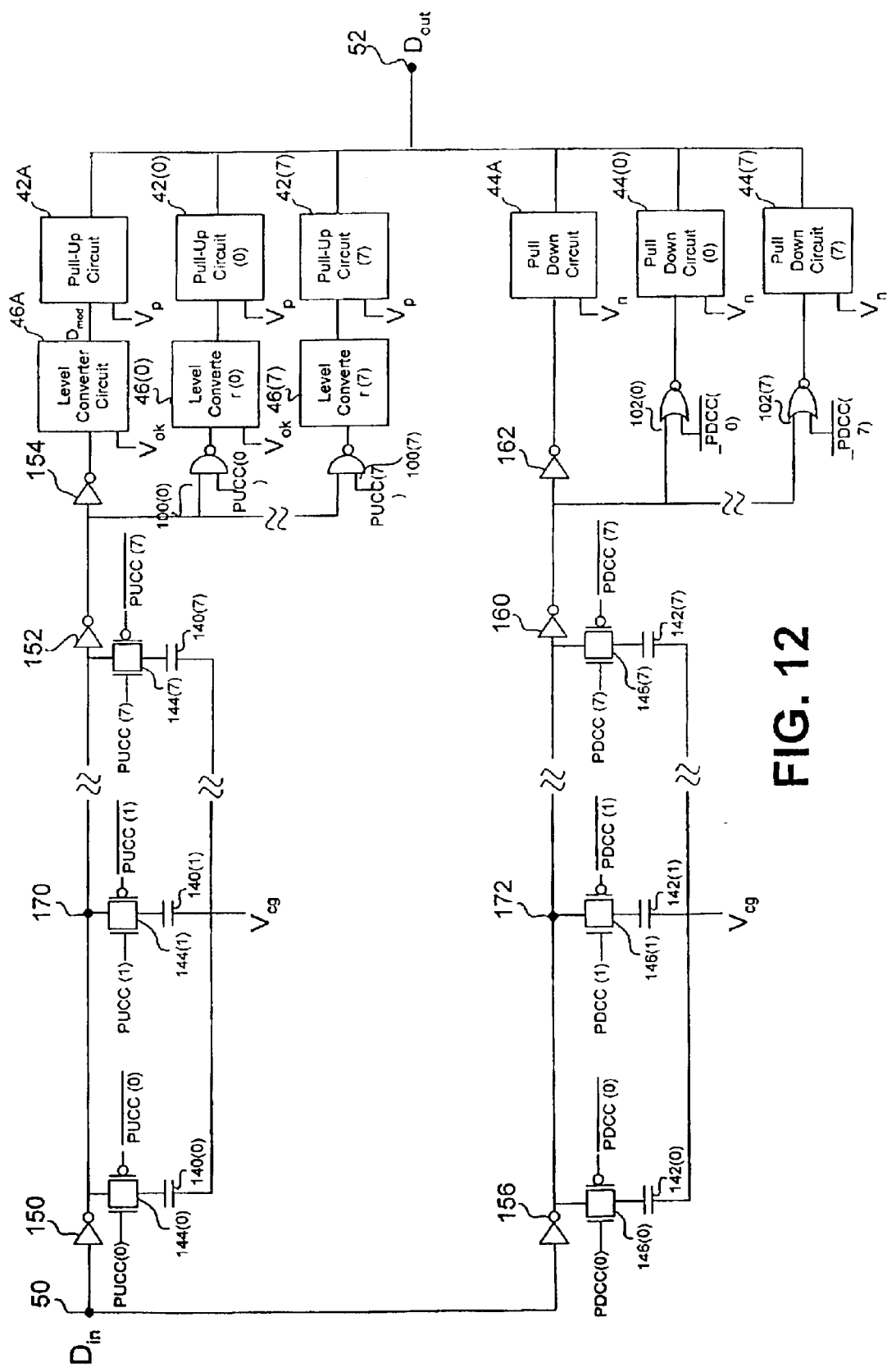
FIG. 12 illustrates another embodiment of a driver contained in the IO device of microprocessor of FIG. 4.

FIG. 12 illustrates another embodiment of driver 40 that can be employed in the microprocessor 32 shown in FIG. 4. FIG. 12 represents a merger of the drivers 40 shown in FIGS. 10 and 11A. Driver 40 shown in FIG. 12 operates substantially similar to that described in FIG. 11A. Additionally, driver 40 has the added ability to ensure that driver 40 charges or discharges output node 52 during predetermined timing windows defined by the specifications for data bus 36 shown in FIG. 4. In one embodiment, the pull up control code PUCC(0)–PUCC(7) provided to switches 144(0)–144(7) and the pull down control code PDCC(0)–PDCC(7) provided to switches 142(0)–142(7) are provided by pull up control code generator 132 and pull down control code generator 134, respectively, described with reference to FIG. 10. Further, the pull up control code PUCC(0)–PUCC(7) provided to nand circuits 100(0)–100(7) and the pull down control code PDCC(0)–PDCC(7) provided to nor gates 102(0)–102(7) are provided by pull up control code generator 182 and pull down control code generator 184, respectively, described with reference to FIG. 11A. Alternatively, pull up control code generator 132 or pull up control code generator 182 may provide pull up control code PUCC(0)–PUCC(7) to both the switches 144(0)–144(7) and nand gates 100(0)–100(7) while either pull down control code generator 134 or pull down control code generator 184 provides pull down control code PDCC(0)–PDCC(7) to both switches 143(0)–143(7) and nor gates 102(0)–102(7).

Figure 13:
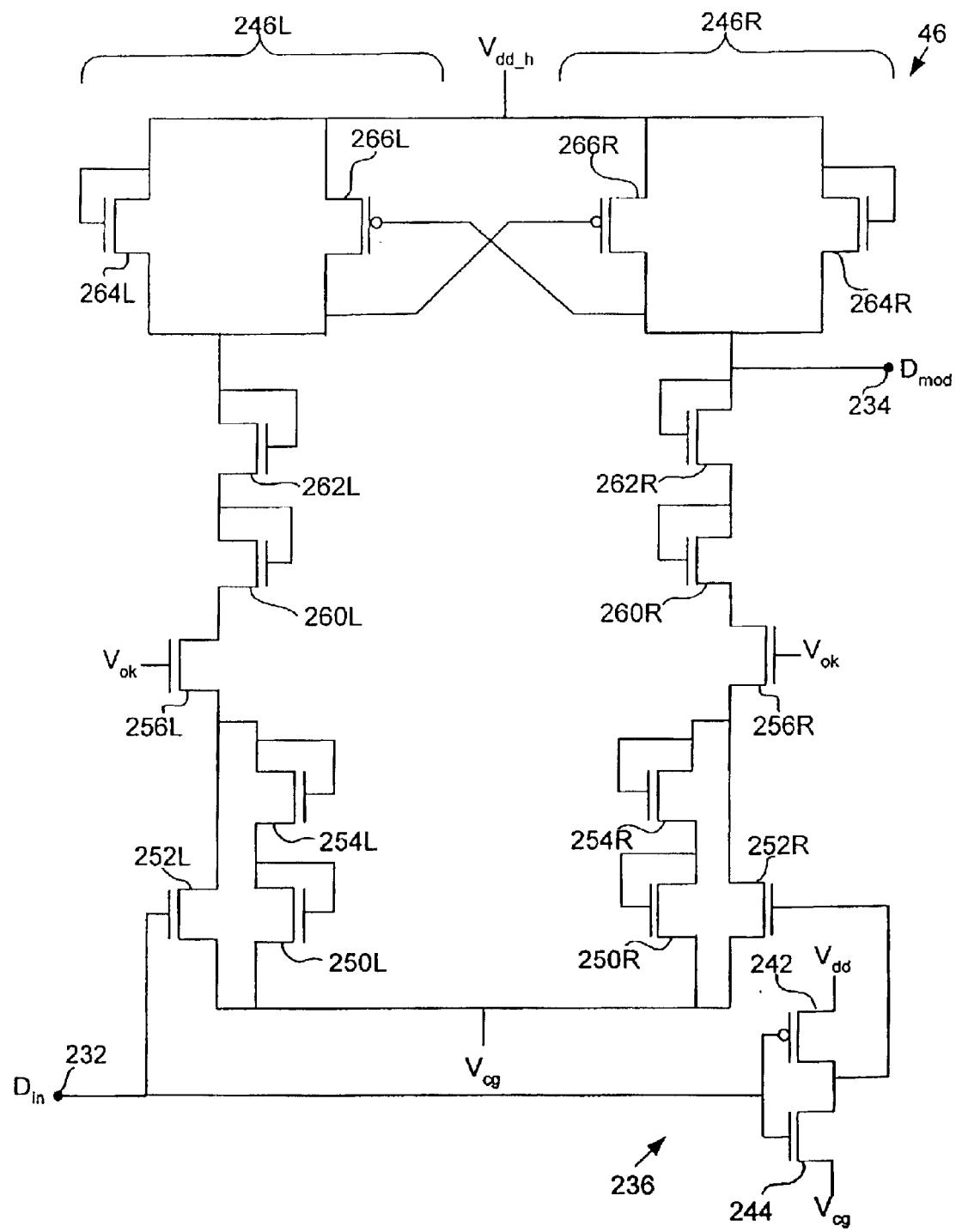
FIG. 13 is a schematic diagram of one embodiment of the level converter circuit employed in the drivers of FIGS. 4, 6, 8 and 9.

FIG. 13 is a schematic diagram of one embodiment of the voltage level converter 46 which can be used in any of the embodiments shown herein. Other embodiments are contemplated. FIG. 13 shows level converter circuit 46 having n-channel and p-channel FETs coupled between an input node 232 and an output note 234. Input node 232 is configured to receive $D_{in}$ which, as noted above, varies between $V_{dd}$ and $V_{cg}$. Circuit 46, as noted above, generates $D_{mod}$ at output node 234. Output node 234 is coupled to the gate of p-channel FET 60 shown in, for example, FIGS. 5 and 7.

In the embodiment shown in FIG. 13, circuit 46 includes an inverter 236 having a p-channel FET 242 coupled to an n-channel FET 244. The gates of FETs 242 and 244 are coupled to input node 232, while the sources of FETs 242 and 244 are coupled to $V_{dd}$ and $V_{cg}$, respectively. The remaining FETs of circuit 46 are divided among substantially symmetric circuits 246L and 246R. More particularly, circuit 246L includes n-channel FETs 250L–264L and p-channel FET 266L, while circuit 246R includes n-channel FETs 250R–264R and p-channel FET 266R.

N-channel FETs 264L and 264R are arranged as drain connected diodes coupled to supply voltage $V_{dd-h}$. P-channel FETs 266L and 266R are cross-coupled with the gate of p-channel FET 266L coupled to the drain of p-channel FET 266R, and with the gate of p-channel FET 266R coupled to the drain of p-channel FET 266L. As shown in FIG. 12, the sources of p-channel FETs 266L and 266R are coupled to $V_{dd-h}$. Output node 234 is coupled to the drain of p-channel FET 266R.

A pair of diode connected n-channel FETs 260R and 262R are coupled between n-channel FET 256R and p-channel FET 266R. Likewise, circuit 246L includes a pair of diode connected n-channel FETs 260L and 262L coupled between n-channel FET 256L and p-channel FET 266L.

The gates of n-channel FETs 256L and 256R are coupled to a DC voltage $V_{ok}$. Voltage $V_{ok}$ is subject to the following limitations:

$$V_{dd-h} - V_{limit} < V_{ok} < V_{cg} + V_{limit} \tag{5}$$

Lastly, circuits 246L and 246R include n-channel FETs 250L through 254L and 250R–254R, respectively. N-channel FETs 250L and 254 are connected as diodes in series, the combination of which is connected in parallel with n-channel FET 252L. Likewise, n-channel FETs 250R and 254R are connected as diodes in series, the combination of which is connected in parallel with n-channel FET 252R. The sources of n-channel FETs 252L and 252R are coupled to $V_{cg}$, while the gates of n-channel FETs 252L and 252R are coupled to the input node 232 and the output of inverter 236, respectively.

Although the present invention has been described in connection with several embodiments, the invention is not intended to be limited to the specific forms set forth herein. On the contrary, it is intended to cover such alternatives, modifications, and equivalents as can be reasonably included within the spirit and scope of the invention as defined by the appended claims.

What is claimed is:

1. An input/output (IO) device comprising:
   an input node for receiving an input data bit signal;
   an output node;
   a plurality of pull-up and pull-down circuit pairs coupled between the input node and the output node, wherein individual ones of the plurality of circuit pairs comprise at least one FET that defines a gate oxide voltage limit,
   wherein individual ones of the plurality of pull-up and pull-down circuit pairs are configured to receive a supply voltage and the input data bit signal, wherein the individual ones of the plurality of pull-up and pull-down circuit pairs are configured to charge and discharge the output node to the supply voltage and ground, respectively, in response to the supply voltage, the input data bit signal, and at least one indicator of an output impedance of the IO device, wherein the supply voltage is greater than the gate oxide voltage limit;

a plurality of first circuits coupled between the input node and respective ones of the plurality of pull-up and pull-down circuit pairs, wherein individual ones of the plurality of first circuits are configured to generate a modified input data bit signal which varies between the supply voltage and an intermediate voltage in response to the supply voltage, the input data bit signal, and the at least one indicator of the output impedance of the IO device, wherein the intermediate voltage is greater than ground but less than the supply voltage.

2. The IO device of claim 1 wherein the individual ones of the plurality of pull-up and pull-down circuit pairs comprise:

a first p-channel FET and a second p-channel FET each comprising a source, drain, and gate;

a first n-channel FET and a second n-channel FET each comprising a source, drain, and gate;

wherein the gate of the first n-channel FET is coupled to the input node;

wherein drains of the first p-channel FET and the second n-channel FET are coupled to the output node;

wherein the source of the second n-channel FET is coupled to the drain of the first n-channel FET;

wherein the source of the first p-channel FET is coupled to the drain the second p-channel FET;

wherein the source of the second p-channel FET is coupled to the supply voltage.

3. An input/output (IO) device comprising:

an input node for receiving an input data bit signal;

an output node;

a plurality of first circuits coupled to the input node, individual ones of the plurality of first circuits being configured to generate a corresponding modified input data bit signal in response to receiving the input data bit signal, wherein of the modified input data bit signals are distinct from the input data bit signal;

a plurality of pull-up and pull-down circuit pairs coupled to respective ones of the plurality of first circuits and the input node, wherein individual ones of the plurality of pull-up and pull-down circuit pairs are configured to charge or discharge the output node in response to the input data bit signal, a respective modified input data bit signal, and at least one indicator of an output impedance of the IO device, individual ones of the plurality of pull-up and pull-down circuit pairs comprising:

a first p-channel FET and a second p-channel FET each comprising a source, drain, and gate;

a first n-channel FET and a second n-channel FET each comprising a source, drain, and gate;

wherein the gate of the first n-channel FET is coupled to the input node;

wherein the gate of the second p-channel FET is coupled to a corresponding one of the plurality of first circuits and configured to receive a respective modified input data bit signal therefrom;

wherein the drain of the first p-channel FET and the second n-channel FET are coupled to the output node;

wherein the source of the second n-channel FET is coupled to the drain of a respective first n-channel FET;

wherein the source of each of the first p-channel FET is coupled to the drain of the second p-channel FET.

4. The IO device of claim 3 wherein the plurality of first circuits generates the modified input data bit signals as a function of the input data bit signal.

5. The IO device of claim 3 wherein the individual ones of the plurality of first circuits generate corresponding ones of the modified input data bit signals with a voltage that varies between an intermediate voltage and a second voltage in response to the second voltage and in response to the input data bit signal that varies between ground and a first voltage, wherein the intermediate voltage is greater than ground but less than the second voltage.

6. The IO device of claim 5:

wherein the modified input data bit signals generated by the plurality of first circuits are substantially equal to the second voltage when the input data bit signal is substantially equal to the first voltage, wherein the second voltage is greater than the first voltage;

wherein the modified input data bit signals generated by the plurality of first circuits are substantially equal to the intermediate voltage when the input data bit signal is substantially equal to ground.

7. The IO device of claim 6 wherein the second voltage is greater than a gate oxide voltage limit of one of the first and second n-channel FETS and the first and second p-channel FETS.

8. The IO device of claim 3 further comprising a first voltage generator for generating a first DC voltage, wherein the gate of individual ones of the first p-channel FETs are coupled to receive the first DC voltage.

9. The IO device of claim 8 further comprising a second voltage generator for generating a second DC voltage, wherein the gate of individual ones of the second n-channel FETs are coupled to receive the second DC voltage.

10. The IO device of claim 8 wherein the individual ones of the first p-channel FETs define a gate oxide voltage limit, wherein the first DC voltage generated by the first voltage generator is less than the gate oxide voltage limit.

11. The IO device of claim 9 wherein the individual ones of the first p-channel FETs define a gate oxide voltage limit, wherein the first DC voltage generated by the first voltage generator and the second DC voltage generated by the second voltage generator are less than the gate oxide voltage limit.

12. The IO device of claim 3 wherein the individual ones of the plurality of pull-up and pull-down circuit paths are configured to drive the output node to a second voltage or ground in response to the input data bit signal that varies between a first voltage and ground, wherein the second voltage is greater than the first voltage.

13. An apparatus comprising:

a microprocessor;

a memory device;

a data bus coupled between the microprocessor and the memory device;

wherein the microprocessor comprises an IO device, the IO device comprising:

an input node for receiving an input data bit signal;

an output node;

a plurality of first circuits coupled to the input node individual ones of which are configured to generate a modified input data bit signal in response to the plurality of first circuits receiving the input data bit signal, wherein individual ones of the modified input data bit signals are distinct from the input data bit signal;

a plurality of pull-up and pull-down circuit pairs coupled to corresponding ones of the plurality of first circuits and the input node, wherein the individual ones of the plurality of circuit pairs are configured to charge or discharge the output node in repsonse to the input data bit signal, a respective modified input data bit signal, and at least one indicator of an output impedance of the IO device, wherein the indivual ones of the plurality of pull-up and pull-down circuit pairs comprise:

a first p-channel FET and a second p-channel FET;

a first n-channel FET and a second n-channel FET;

wherein a gate of the first n-channel FET is coupled to the input node;

wherein a gate of the second p-channel FET is coupled to a corresponding one of the plurality of first circuits and configured to receive a respective modified input data bit signal therefrom;

wherein drains of the first p-channel FET and the second n-channel FET are coupled to the IO device output node;

wherein a source of the second n-channel FET is coupled to a drain of a respective first n-channel FET; and wherein a source of the first p-channel FET is coupled to a drain of a respective second p-channel FET.

* * * * *

UNITED STATES PATENT AND TRADEMARK OFFICE
CERTIFICATE OF CORRECTION

PATENT NO. : 6,906,561 B2
DATED : June 14, 2005
INVENTOR(S) : Yu et at.

It is certified that error appears in the above-identified patent and that said Letters Patent is hereby corrected as shown below:

Title page,
Item [56], References Cited, OTHER PUBLICATIONS, the words "With Inproved Impedance Control," should read -- With Improved Impedance Control --.

Column 2,
Line 33, the words "$D_{in}$ Characteristics of driver" should read -- $D_{in}$. Characteristics of driver --.

Column 5,
Line 38, the word "$V_{dd-b}$" should read -- $V_{dd\_h}$ --.
Line 58, the words "from $V_p$ In general" should read -- from $V_p$. In general --.

Signed and Sealed this

Eighteenth Day of October, 2005

JON W. DUDAS
*Director of the United States Patent and Trademark Office*